US012597586B2

(12) United States Patent
Sato et al.

(10) Patent No.: US 12,597,586 B2
(45) Date of Patent: Apr. 7, 2026

(54) PLASMA PROCESSING APPARATUS AND MATCHING METHOD

(71) Applicant: TOKYO ELECTRIC LIMITED, Tokyo (JP)

(72) Inventors: Sho Sato, Miyagi (JP); Ken Yoshida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1067 days.

(21) Appl. No.: 17/175,724

(22) Filed: Feb. 15, 2021

(65) Prior Publication Data

US 2021/0257187 A1 Aug. 19, 2021

(30) Foreign Application Priority Data

Feb. 19, 2020 (JP) ................................. 2020-026391

(51) Int. Cl.
*H01J 37/32* (2006.01)
(52) U.S. Cl.
CPC .............................. *H01J 37/32183* (2013.01)
(58) Field of Classification Search
None
See application file for complete search history.

(56) References Cited

U.S. PATENT DOCUMENTS

| | | | | |
|---|---|---|---|---|
| 9,378,931 | B2 * | 6/2016 | Kwon | ............... H01J 37/32146 |
| 10,296,676 | B2 * | 5/2019 | Howald | ................ G06F 30/367 |

| | | | | |
|---|---|---|---|---|
| 2010/0140221 | A1 * | 6/2010 | Kikuchi | ............ H01J 37/32091 |
| | | | | 156/345.43 |
| 2014/0363977 | A1 * | 12/2014 | Morimoto | ......... H01J 37/32183 |
| | | | | 438/711 |
| 2016/0079037 | A1 * | 3/2016 | Hirano | .............. H01J 37/32183 |
| | | | | 156/345.28 |
| 2016/0126069 | A1 | 5/2016 | Kwon et al. | |
| 2017/0330764 | A1 * | 11/2017 | Lai | .................... H01J 37/32082 |
| 2020/0058470 | A1 * | 2/2020 | Ventzek | ............ H01L 21/67069 |

FOREIGN PATENT DOCUMENTS

| | | |
|---|---|---|
| JP | 2015-090770 A | 5/2015 |
| JP | 2019-186099 A | 10/2019 |
| TW | 201801573 A | 1/2018 |

* cited by examiner

*Primary Examiner* — Ram N Kackar
(74) *Attorney, Agent, or Firm* — XSENSUS LLP

(57) ABSTRACT

A plasma processing apparatus includes a chamber in which a plasma processing is performed, an electrode that supplies a radio-frequency power to the chamber for the plasma processing; a radio-frequency power supply electrically connected to the electrode, and a matching device connected between the radio-frequency power supply and the electrode. The radio-frequency power supply supplies one of a modulated wave and a continuous wave of a radio-frequency power to the electrode. The modulated wave is generated by alternately increasing or decreasing the power level of the radio-frequency power. The matching device gradually changes a load impedance to a target impedance during a period in which the continuous wave is supplied before or after the power supplied from the radio-frequency power supply to the electrode is switched from one of the modulated wave and the continuous wave to the other.

4 Claims, 10 Drawing Sheets

PLASMA PROCESSING APPARATUS AND MATCHING METHOD

CROSS-REFERENCE TO RELATED APPLICATION

This application is based on and claims priority from Japanese Patent Application No. 2020-026391 filed on Feb. 19, 2020 with the Japan Patent Office, the disclosure of which is incorporated herein in its entirety by reference.

TECHNICAL FIELD

The present disclosure relates to a plasma processing apparatus and a matching method.

BACKGROUND

Plasma processing apparatuses are used in the manufacture of electronic devices. A plasma processing apparatus includes a chamber, electrodes, a radio-frequency power supply, and a matching device. Radio-frequency power is applied to the electrodes from the radio-frequency power supply in order to excite the gas supplied in the chamber to generate plasma. The matching device is configured to match the output impedance of the radio-frequency power supply with the impedance on the load side of the radio-frequency power supply, that is, the load impedance.

In a plasma processing apparatus, a technique has been proposed in which the radio-frequency power having an alternately increased or decreased power, that is, the modulated wave of radio-frequency power is supplied to the electrodes. Such a technique is described in, for example, Japanese Patent Laid-Open Publication Nos. 2015-090770 and 2019-186099.

SUMMARY

In an embodiment, a plasma processing apparatus is provided. The plasma processing apparatus includes a chamber, an electrode, a radio-frequency power supply, and a matching device. The radio-frequency power supply is electrically connected to the electrodes. The radio-frequency power supply is configured to generate radio-frequency power supply supplied to the electrode for plasma processing in the chamber. The matching device is connected between the radio-frequency power supply and the electrodes. The matching device is configured to set the load impedance, which is the load-side impedance of the radio-frequency power supply. The radio-frequency power supply is configured to supply the power wave of one of a modulated wave and a continuous wave of radio-frequency power to the electrode in the preceding period of two consecutive periods, and supply the power wave of the other of the modulated wave and the continuous wave to the electrode in the subsequent period of the two consecutive periods. The radio-frequency power supply generates the modulated wave so that the power level of the radio-frequency power in the first sub-period of the alternating first sub-period and second sub-period is higher than the power level of the radio-frequency power in the second sub-period. The matching device is configured to gradually change the load impedance to the target impedance for subsequent periods during a period in which the continuous wave is supplied in the two consecutive periods.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
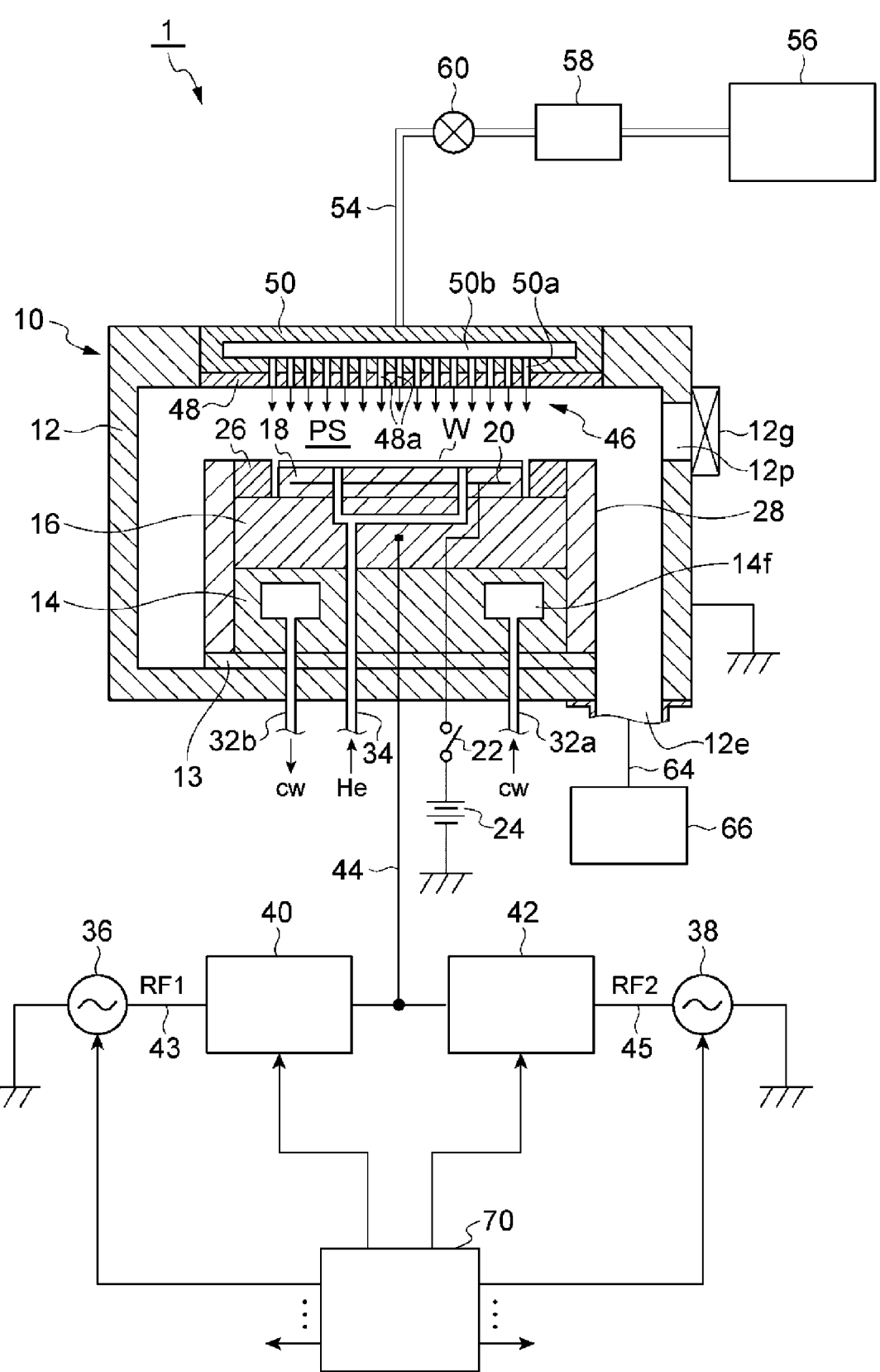
FIG. 1 is a diagram schematically illustrating a plasma processing apparatus according to an embodiment.

In the following detailed description, reference is made to the accompanying drawing, which form a part thereof. The illustrative embodiments described in the detailed description, drawing, and claims are not meant to be limiting. Other embodiments may be utilized, and other changes may be made without departing from the spirit or scope of the subject matter presented here.

Various embodiments will be described below.

In an embodiment, a plasma processing apparatus is provided. The plasma processing apparatus includes a chamber, an electrode, a radio-frequency power supply, and a matching device. The radio-frequency power supply is electrically connected to the electrodes. The radio-frequency power supply is configured to generate radio-frequency power supplied to the electrode for plasma processing in the chamber. The matching device is connected between the radio-frequency power supply and the electrodes. The matching device is configured to set the load impedance, which is the load-side impedance of the radio-frequency power supply. The radio-frequency power supply is configured to supply the power wave of one of the modulated wave and the continuous wave of radio-frequency power to the electrode in the preceding period of two consecutive periods, and supply the power wave of the other of the modulated wave and the continuous wave to the electrode in the subsequent period of the two consecutive periods. The radio-frequency power supply generates the modulated wave so that the power level of the radio-frequency power in the first sub-period of the alternating first sub-period and second sub-period is higher than the power level of the radio-frequency power in the second sub-period. The matching device is configured to gradually change the load impedance to the target impedance for the subsequent period during a period in which the continuous wave is supplied in the two consecutive periods.

In the above embodiment, the matching device gradually changes the load impedance to the target impedance for the subsequent period during the period during which the continuous wave is supplied before or after the power supplied from the radio-frequency power supply to the electrode is switched from one power wave to the other power wave. Therefore, the matching device may follow the load impedance to be set after the power supplied from the radio-frequency power supply to the electrodes is switched from one power wave to the other power wave. Therefore, it is possible to reduce the reflection after the power supplied from the radio-frequency power supply to the electrode is switched from one of the modulated wave and the continuous wave to the other.

In the embodiment, the matching device may gradually change the load impedance during the period in which the continuous wave is supplied so that the absolute value of the reflectance coefficient of the radio-frequency power is gradually changed to the set target value for the subsequent period.

In the embodiment, the matching device may be configured to gradually reduce the load impedance so that the absolute value of the reflectance coefficient of the radio-frequency power is gradually reduced to zero after the power supplied from the radio-frequency power supply to the electrodes is switched from the modulated wave to the continuous wave.

In the embodiment, the matching device may gradually change the load impedance before the power supplied to the electrodes is switched from the continuous wave to the modulated wave so that the absolute value of the reflectance coefficient of the radio-frequency power is gradually increased to a set target value larger than zero. The set target value may be 0.3 or more and 0.5 or less.

In the embodiment, the matching device may be configured to gradually change the absolute value of the reflectance coefficient during the period in which the continuous wave is supplied to the set target value for the subsequent period. The time length of each of a plurality of sub-periods is set to 0.5 seconds or more, and a difference between the target value of the absolute value of the reflectance coefficient in one sub-period and the target value of the absolute value of the reflectance coefficient in the other sub-period of any two consecutive sub-periods included in the plurality of sub-periods is set to 0.2 or less. Alternatively, the time length is set to 0.2 seconds or more, and the difference is set to 0.1 or less. The time length may be set to 0.5 seconds or more, and the difference may be set to 0.05 or less.

In the embodiment, the matching device may be configured to adjust the load impedance of the radio-frequency power supply to a target impedance different from the output impedance of the radio-frequency power supply during the period in which the modulated wave is supplied out of two consecutive periods. The load impedance of the radio-frequency power supply is specified by the measured value of the load impedance during the monitoring period within the first sub-period. According to this embodiment, the reflection from the load on the modulated wave may be reduced during the period in which the modulated wave is supplied.

In the embodiment, the monitoring period may be a period that starts after a predetermined time length has elapsed from the start of the first sub-period.

In the embodiment, the matching device may be configured to specify the target impedance from the set target value of the absolute value of the reflectance coefficient of the modulated wave during the period in which the modulated wave is supplied. In the embodiment, this set target value may be 0.3 or more and 0.5 or less.

In the embodiment, the radio-frequency power supply may be configured to adjust the power level of the radio-frequency power so that the load power level during the period of supply of the modulated wave approaches or matches the target power level. The load power level is the difference between the power level of the traveling wave of the modulated wave and the power level of the reflected wave of the modulated wave. When the target impedance is different from the output impedance of the radio-frequency power supply, a reflection occurs. According to this embodiment, even when the reflection occurs, the modulated wave of the target power level may be coupled to plasma.

In another embodiment, a matching method is provided. The matching method is performed in the plasma processing apparatus. The plasma processing apparatus includes a chamber, electrodes, a radio-frequency power supply, and a matching device. The radio-frequency power supply is electrically connected to the electrodes. The radio-frequency power supply is configured to generate radio-frequency power supplied to the electrodes for plasma processing in the chamber. The matching device is connected between the radio-frequency power supply and the electrode, and is configured to set the load impedance, which is the impedance on the load side of the radio-frequency power supply. The matching method includes a step of supplying the power wave of one of the modulated wave and the continuous wave of radio-frequency power from the radio-frequency power supply to the electrode in a preceding period of two consecutive periods. The modulated wave is generated so that the power level of the radio-frequency power in the first sub-period of the alternating first sub-period and second sub-period is higher than the power level of the radio-frequency power in the second sub-period. The matching method further includes supplying the power wave of the other of the modulated wave and the continuous wave of radio-frequency power to the electrode in the subsequent period of the two consecutive periods. The matching method further includes gradually changing the load impedance to the target impedance for the subsequent period during the period in which the continuous wave is supplied out of two consecutive periods.

In the embodiment, in the process of gradually changing the load impedance, the load impedance may be gradually changed so that the absolute value of the reflectance coefficient of the radio-frequency power is gradually changed to the set target value for the subsequent period.

In the embodiment, after the power supplied to the electrodes is switched from the modulated wave to the continuous wave, the load impedance may be changed gradually so that the absolute value of the reflectance coefficient of the radio-frequency power is gradually reduced to zero.

In the embodiment, before the power supplied to the electrodes is switched from the continuous wave to the modulated wave, the load impedance may be changed gradually so that the absolute value of the reflectance coefficient of the radio-frequency power is gradually increased to the set target value larger than zero. The set target value may be 0.3 or more and 0.5 or less.

In the embodiment, during the period in which the continuous wave is supplied, the load impedance may be changed gradually so that the absolute value of the reflectance coefficient is gradually changed to the set target value for the subsequent period through a plurality of consecutive sub-periods. The time length of each of a plurality of sub-periods is set to 0.5 seconds or more, and a difference between the target value of the absolute value of the reflectance coefficient in one sub-period and the target value of the absolute value of the reflectance coefficient in the other sub-period of any two consecutive sub-periods included in the plurality of sub-periods is set to 0.2 or less. Alternatively, the time length is set to 0.2 seconds or more, and the difference is set to 0.1 or less. The time length may be set to 0.5 seconds or more, and the difference may be set to 0.05 or less.

Hereinafter, various embodiments will be described in detail with reference to the drawings. Further, the same reference numerals are given to the same or corresponding parts in each drawing.

FIG. 1 is a diagram schematically illustrating the plasma processing apparatus according to the embodiment. The plasma processing apparatus 1 illustrated in FIG. 1 is a capacitively coupled plasma processing apparatus. The plasma processing apparatus 1 includes a chamber 10. The chamber 10 provides an internal space 10s therein.

The chamber 10 includes a chamber body 12. The chamber body 12 has a substantially cylindrical shape. The internal space of the chamber 10 is provided inside chamber body 12. The chamber body 12 is formed of a material such as aluminum. A plasma-resistant film is formed on the inner wall surface of the chamber body 12. The film may be a ceramic film such as a film formed by anodization or a film formed from yttrium oxide. The chamber body 12 is grounded. An opening 12p is formed on the side wall of the chamber body 12. A substrate W passes through the opening 12p when being conveyed between the internal space of the chamber 10 and the outside of the chamber 10. The opening 12p may be opened and closed by a gate valve 12g. The gate valve 12g is provided along the side wall of the chamber body 12.

An insulating plate 13 is provided on the bottom of the chamber body 12. The insulating plate 13 is formed of, for example, ceramic. A support base 14 is provided on the insulating plate 13. The support base 14 has a substantially disk shape. The support base 14 supports a susceptor 16 provided thereon. The susceptor 16 is provided in the chamber 10. The susceptor 16 is formed of a conductive material such as aluminum. The susceptor 16 constitutes a lower electrode.

The susceptor 16 supports an electrostatic chuck 18 provided thereon. The electrostatic chuck 18 is provided in the chamber 10. The electrostatic chuck 18 is configured to hold the substrate W mounted thereon. The electrostatic chuck 18 has a main body and electrodes 20. The main body of the electrostatic chuck 18 is formed of a dielectric material and has a substantially disk shape. The electrode 20 is a conductive film and is provided in the main body of the electrostatic chuck 18. A DC power supply 24 is electrically connected to the electrode 20 via a switch 22. When a DC voltage from the DC power supply 24 is applied to the electrode 20, an electrostatic attraction is generated between the substrate W and the electrostatic chuck 18. The substrate W is attracted to the electrostatic chuck 18 by the generated electrostatic attraction and is held by the electrostatic chuck 18.

The susceptor 16 and the electrostatic chuck 18 constitute a substrate support. The substrate support supports an edge ring 26 mounted thereon. The edge ring 26 is arranged so as to surround the edge of the substrate W. That is, the substrate W is arranged in the region surrounded by the edge ring 26 and on the electrostatic chuck 18. The outer peripheral surfaces of the susceptor 16 and the support base 14 are each covered with a cylindrical inner wall member 28. The inner wall member 28 is formed of, for example, quartz.

A flow path 14f is formed inside the support base 14. The flow path 14f extends in a spiral shape with respect to the central axis extending in, for example, the vertical direction. A heat exchange medium cw (e.g., a coolant such as cooling water) is supplied to the flow path 14f from a supply device (e.g., a chiller unit 22) provided outside the chamber 10 via a pipe 32a. The heat exchange medium supplied to the flow path 14f is recovered by the supply device via the pipe 32b. The temperature of the substrate W is adjusted by adjusting the temperature of the heat exchange medium by the supply device. Further, the plasma processing apparatus 1 provides a gas supply line 34. The gas supply line 34 is provided to supply heat transfer gas (e.g., He gas) to a gap between the upper surface of the electrostatic chuck 18 and the back surface of the substrate W.

The plasma processing apparatus 1 may include one or more radio-frequency power supplies. In the embodiment, the plasma processing apparatus 1 includes a first radio-frequency power supply (i.e., a radio-frequency power supply 36) and a second radio-frequency power supply (i.e., a radio-frequency power supply 38). The radio-frequency power supply 36 is connected to the susceptor 16 (e.g., the lower electrode) via a conductor 44 (e.g., a feeding rod) and the first matching device (i.e., the matching device 40). The radio-frequency power supply 38 is connected to the susceptor 16 (e.g., the lower electrode) via the conductor 44 and the first matching device (i.e., the matching device 42). Further, the radio-frequency power supply 36 may be connected to the upper electrode (to be described later), not to the lower electrode, via the matching device 40. The plasma processing apparatus 1 may not be provided with one of a set of the radio-frequency power supply 36 and the matching device 40 and a set of the radio-frequency power supply 38 and the matching device 42.

The radio-frequency power supply 36 is configured to generate a first radio-frequency power (i.e., radio-frequency power RF1) for plasma processing in the chamber 10. The radio-frequency power RF1 is mainly used for plasma generation. The fundamental frequency $f_{B1}$ of the radio-frequency power RF1 is, for example, 100 MHz. The radio-frequency power supply 38 is configured to generate a second radio-frequency power (i.e., radio-frequency power RF2) for plasma processing in the chamber 10. The frequency of the radio-frequency power RF2 is lower than the frequency of the radio-frequency power RF1. The fundamental frequency $f_{B2}$ of the radio-frequency power RF2 is, for example, 13.56 MHz.

The matching device 40 includes a circuit for setting the load impedance, which is the impedance on the load side (e.g., the lower electrode side) of the radio-frequency power supply 36. The matching device 42 includes a circuit for setting the load impedance, which is the impedance on the load side (e.g., the lower electrode side) of the radio-frequency power supply 38. Each of the matching device 40 and the matching device 42 may be an electronically controlled matching device. Details of each of the matching device 40 and the matching device 42 will be described later.

The matching device 40 and the conductor 44 form a part of a power feeding line 43. The radio-frequency power RF1 is supplied to the susceptor 16 via the power feeding line 43. The matching device 42 and the conductor 44 form a part of a power feeding line 45. The radio-frequency power RF2 is supplied to the susceptor 16 via the power feeding line 45.

The plasma processing apparatus 1 further includes an upper electrode 46. The upper electrode 46 constitutes the top of the chamber 10. The upper electrode 46 is provided to close an opening at the upper end of the chamber body 12. The internal space of the chamber 10 includes a processing region PS. The processing region PS is a space between the upper electrode 46 and the susceptor 16. The plasma processing apparatus 1 generates plasma in the processing region PS by the radio-frequency electric field generated between the upper electrode 46 and the susceptor 16. The upper electrode 46 is grounded. Further, when the radio-frequency power supply 36 is connected to the upper electrode 46, not to the lower electrode, via the matching device 40, the upper electrode 46 is not grounded, and the upper electrode 46 and the chamber body 12 are electrically separated from each other.

The upper electrode 46 includes a top plate 48 and a support 50. A plurality of gas discharge holes 48a is formed in the top plate 48. The top plate 48 is formed of a silicon-based material such as, for example, Si or SiC. The support 50 is a member that detachably supports the top plate 48, is formed of a conductor such as aluminum, and has a plasma-resistant film formed on its surface.

A gas buffer chamber 50b is formed inside the support 50. Further, a plurality of gas holes 50a is formed in the support 50. Each of the plurality of gas holes 50a extends from the gas buffer chamber 50b and communicates with the plurality of gas discharge holes 48a. A gas supply pipe 54 is connected to the gas buffer chamber 50b. A gas source 56 is connected to the gas supply pipe 54 via a flow rate controller 58 (e.g., a mass flow controller) and an on-off valve 60. The gas from the gas source 56 is supplied to the internal space of the chamber 10 through the flow rate controller 58, the on-off valve 60, the gas supply pipe 54, the gas buffer chamber 50b, and the plurality of gas discharge holes 48a. The flow rate of the gas supplied from the gas source 56 to the internal space of the chamber 10 is adjusted by the flow rate controller 58.

An exhaust port 12e is provided at the bottom of the chamber body 12 below the space between the susceptor 16 and the side wall of the chamber body 12. An exhaust pipe 64 is connected to the exhaust port 12e. The exhaust pipe 64 is connected to an exhaust device 66. The exhaust device 66 includes a pressure regulator such as an automatic pressure control valve and a vacuum pump such as a turbo molecular pump. The exhaust device 66 depressurizes the internal space of the chamber 10 to a designated pressure.

The plasma processing apparatus 1 further includes a main control unit 70. The main control unit 70 includes one or more microcomputers. The main control unit 70 may include a storage device such as a processor and a memory, an input device such as a keyboard, a display device, and a signal input/output interface. The processor of the main control unit 70 executes software (program) stored in the storage device to control the individual operation of each part of the plasma processing apparatus 1 and the entire operation (sequence) of the plasma processing apparatus 1 according to the recipe data. The main control unit 70 controls, for example, a radio-frequency power supply 36, a radio-frequency power supply 38, a matching device 40, a matching device 42, a flow rate controller 58, an on-off valve 60, and an exhaust device 66.

When plasma processing is performed in the plasma processing apparatus 1, the gate valve 12g is first opened. Next, the substrate W is loaded into the chamber 10 via the opening 12p and placed on the electrostatic chuck 18. Then, the gate valve 12g is closed. Next, the processing gas is supplied from the gas source 56 to the internal space of the chamber 10, and the exhaust device 66 is operated to set the pressure in the internal space of the chamber 10 to the designated pressure. Further, radio-frequency power RF1 and/or radio-frequency power RF2 is supplied to the susceptor 16. Further, a DC voltage from the DC power supply 24 is applied to the electrode 20 of the electrostatic chuck 18, and the substrate W is held by the electrostatic chuck 18. Then, the processing gas is excited by a radio-frequency electric field formed between the susceptor 16 and the upper electrode 46. As a result, plasma is generated in the processing region PS.

Figure 2:
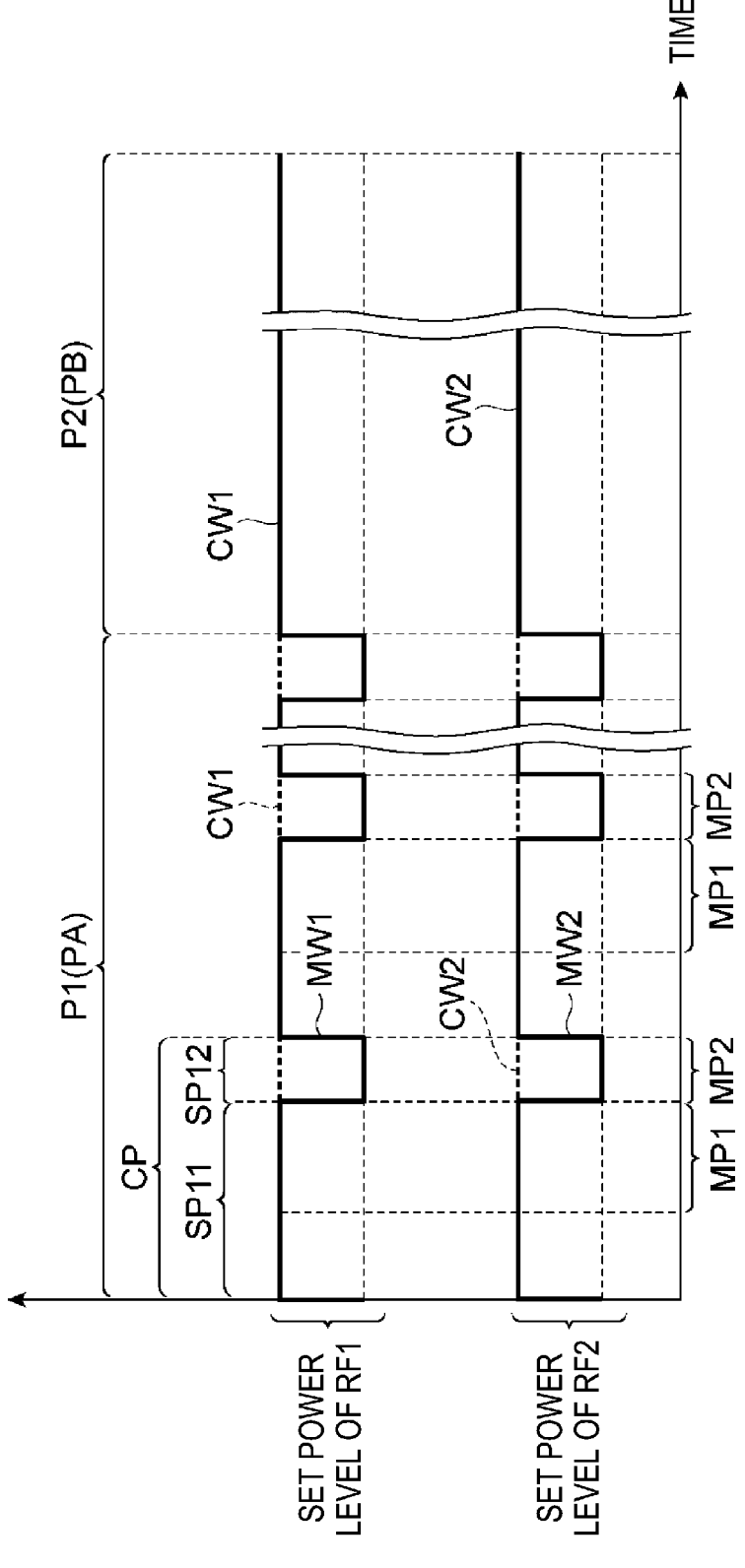
FIG. 2 is a diagram illustrating an example of a timing chart of a first radio-frequency power and a second radio-frequency power.
Figure 3:
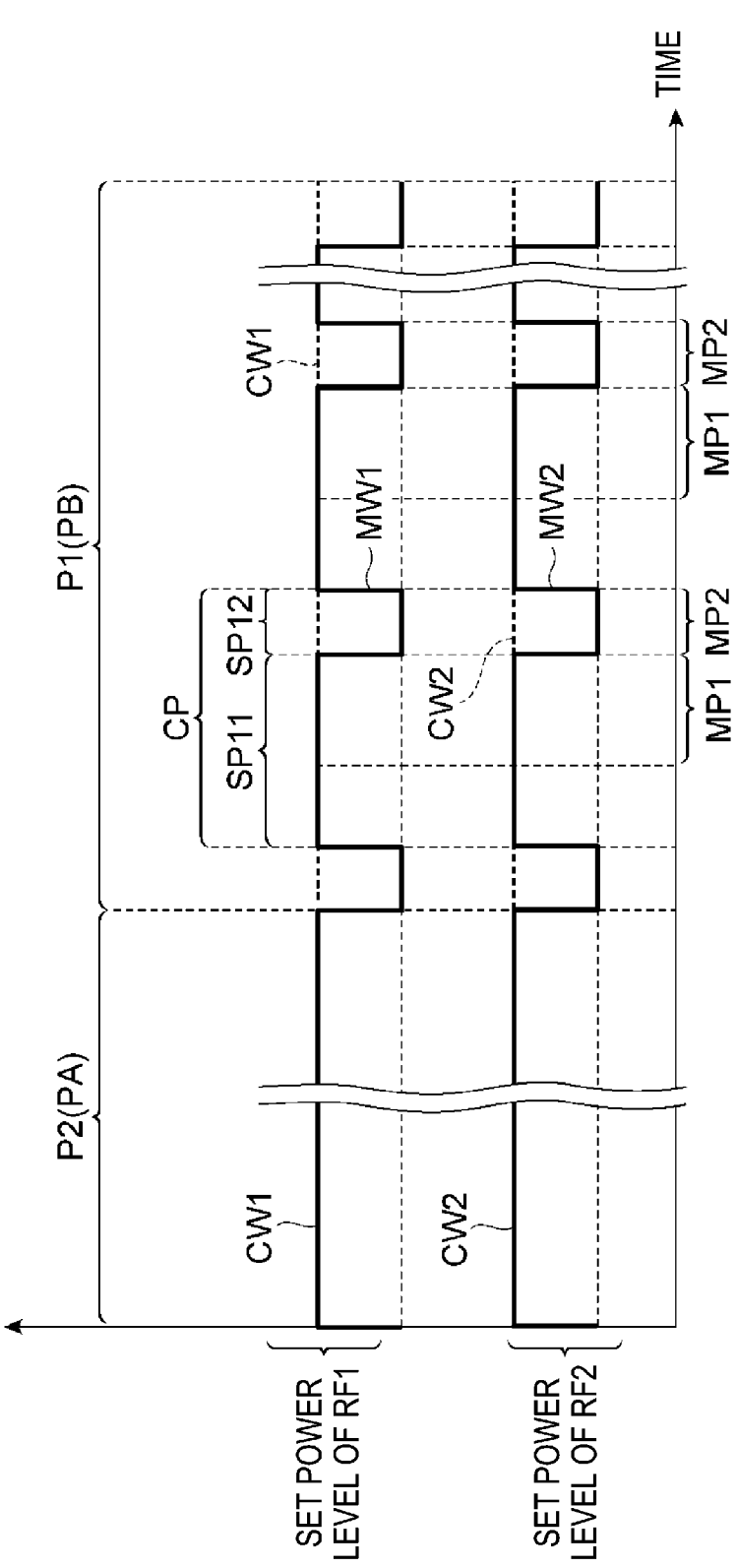
FIG. 3 is a diagram illustrating another example of a timing chart of a first radio-frequency power and a second radio-frequency power.

In the following descriptions, FIGS. 2 to 3 will be referenced together with FIG. 1. FIG. 2 is a diagram illustrating an example of a timing chart of the first radio-frequency power and the second radio-frequency power. FIG. 3 is a diagram illustrating another example of a timing chart of the first radio-frequency power and the second radio-frequency power. The plasma processing apparatus 1 is configured to utilize at least one of a modulated wave MW1 of the radio-frequency power RF1 and a modulated wave MW2 of the radio-frequency power RF2 for plasma processing in the chamber 10 during a period P1. The modulated wave MW1 is generated by the radio-frequency power supply 36. The modulated wave MW2 is generated by the radio-frequency power supply 38. As illustrated by the dotted line in FIGS. 2 and 3, either a continuous wave CW1 of the radio-frequency power RF1 or a continuous wave CW2 of the radio-frequency power RF2 may be used in the period P1. The continuous wave CW1 is generated by the radio-frequency power supply 36. The continuous wave CW2 is generated by the radio-frequency power supply 38. The mode in which the modulated wave MW1 and the modulated wave MW2 are used in the period P1 is a first mode. The mode in which the modulated wave MW1 and the modulated wave CW2 are used in the period P1 is a second mode. The mode in which the modulated wave CW1 and the modulated wave MW2 are used in the period P1 is a third mode.

The period P1 includes alternating first sub-period SP11 and second sub-period SP12. The modulated wave MW1 is generated by the radio-frequency power supply 36 so that the power level of the radio-frequency power RF1 in the first sub-period SP11 is higher than the power level of the radio-frequency power RF1 in the second sub-period SP12. The power level of the radio-frequency power RF1 in the second sub-period SP12 may be 0 W. The modulated wave MW2 is generated by the radio-frequency power supply 38 so that the power level of the radio-frequency power RF2 in the first sub-period SP11 is higher than the power level of the radio-frequency power RF2 in the second sub-period SP12. The power level of the radio-frequency power RF2 in the second sub-period SP12 may be 0 W.

The first sub-period SP11 and the subsequent second sub-period SP12 constitute one cycle CP. The ratio of the first sub-period SP11 in one cycle CP, that is, the duty ratio may be any value. For example, the duty ratio may be controlled to a value within the range of 10% or more and 90% or less. Further, the reciprocal of the one-cycle CP, that is, the modulation frequency may be controlled to any frequency. However, the modulation frequency is lower than the fundamental frequency $f_{B1}$ and the fundamental frequency $f_{B2}$. The modulation frequency may be, for example, a frequency in the range of 0.1 kHz or more and 100 kHz or less.

Further, the plasma processing apparatus 1 is configured to utilize the continuous wave CW1 and the continuous wave CW2 in a period P2. That is, the radio-frequency power RF1 and the radio-frequency power RF2 are continuously supplied between the start time of the period P2 and the end time of the period P2. The time length of the period P2 is longer than the time length of the one-cycle CP.

The period P1 and the period P2 are two consecutive periods. As illustrated in FIG. 2, the period P1 of the two consecutive periods may be the preceding period PA and the period P2 may be the subsequent period PB. Further, as illustrated in FIG. 3, the period P2 of the two consecutive periods may be the preceding period PA and the period P1 may be the subsequent period PB. The period P1 and the period P2 may be repeated alternately. That is, the radio-frequency power supply 36 supplies a power wave W11 in the preceding period PA. The power wave W11 is one of the modulated wave MW1 and the continuous wave CW1. The radio-frequency power supply 36 supplies the power wave W11 or the power wave W12 in the subsequent period PB. The power wave W12 is the other of the modulated wave MW1 and the continuous wave CW1. The radio-frequency power supply 38 supplies a power wave W21 in the preceding period PA. The power wave W21 is one of the modulated wave MW2 and the continuous wave CW2. The radio-frequency power supply 38 supplies the power wave W21 or a power wave W22 in the subsequent period PB. The power wave W22 is the other of the modulated wave MW2 and the continuous wave CW2. In the subsequent period PB, at least one of the power wave W12 and the power wave W22 is supplied.

Figure 4:
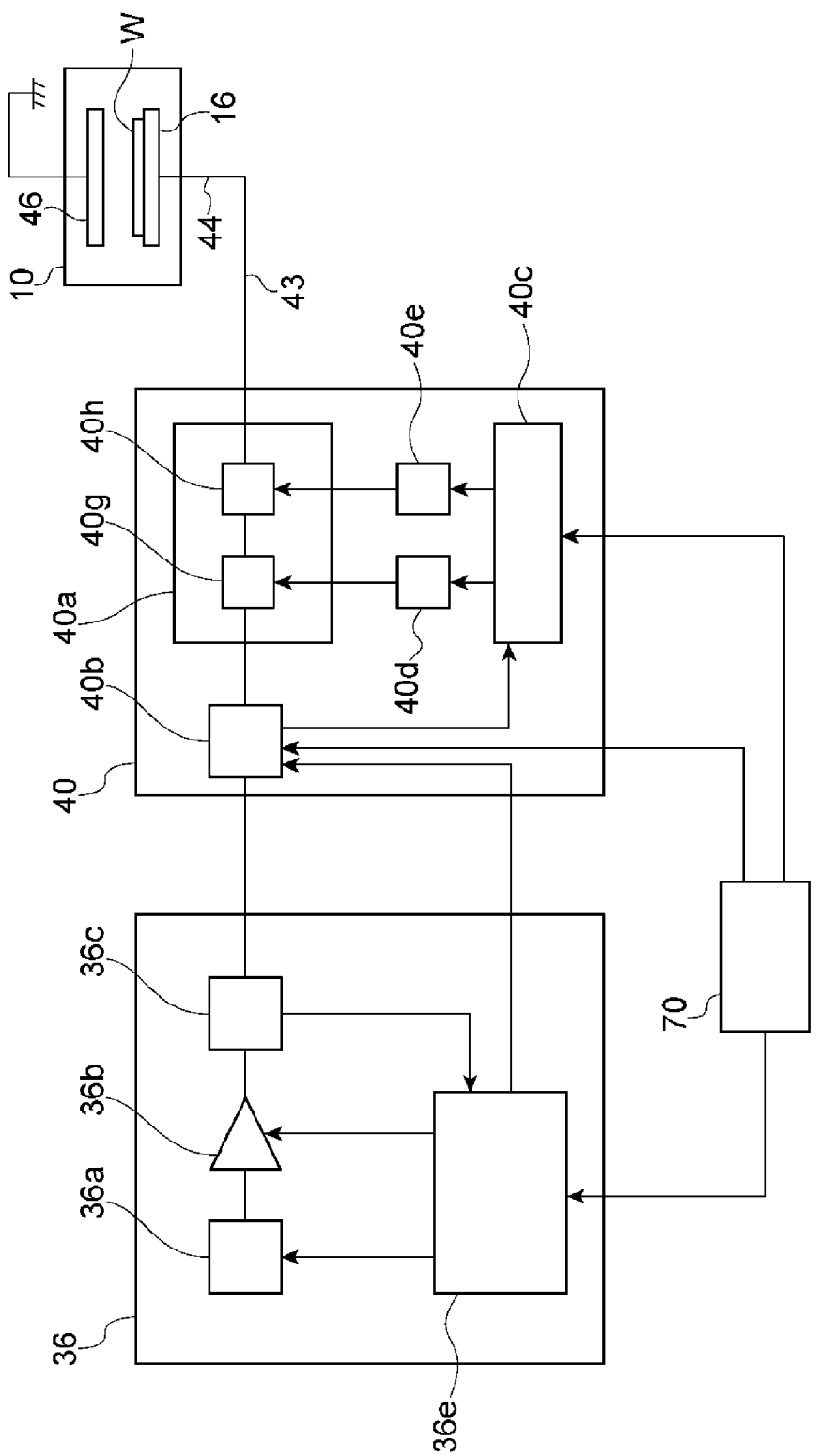
FIG. 4 is a diagram illustrating a configuration example of a first radio-frequency power supply and a first matching device of the plasma processing apparatus illustrated in FIG. 1.
Figure 5:
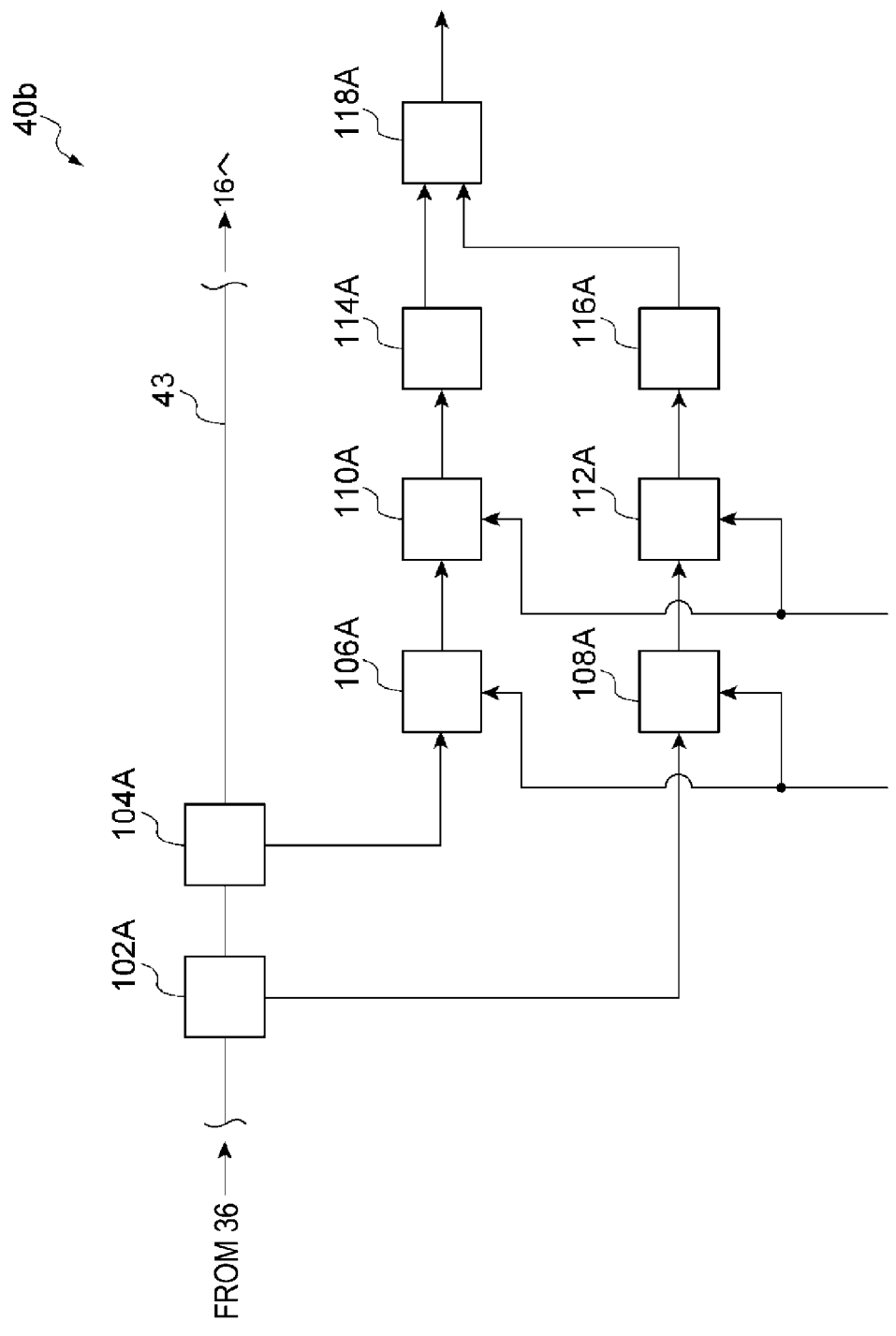
FIG. 5 is a diagram illustrating a configuration example of a sensor of the first matching device of the plasma processing apparatus illustrated in FIG. 1.
Figure 6:
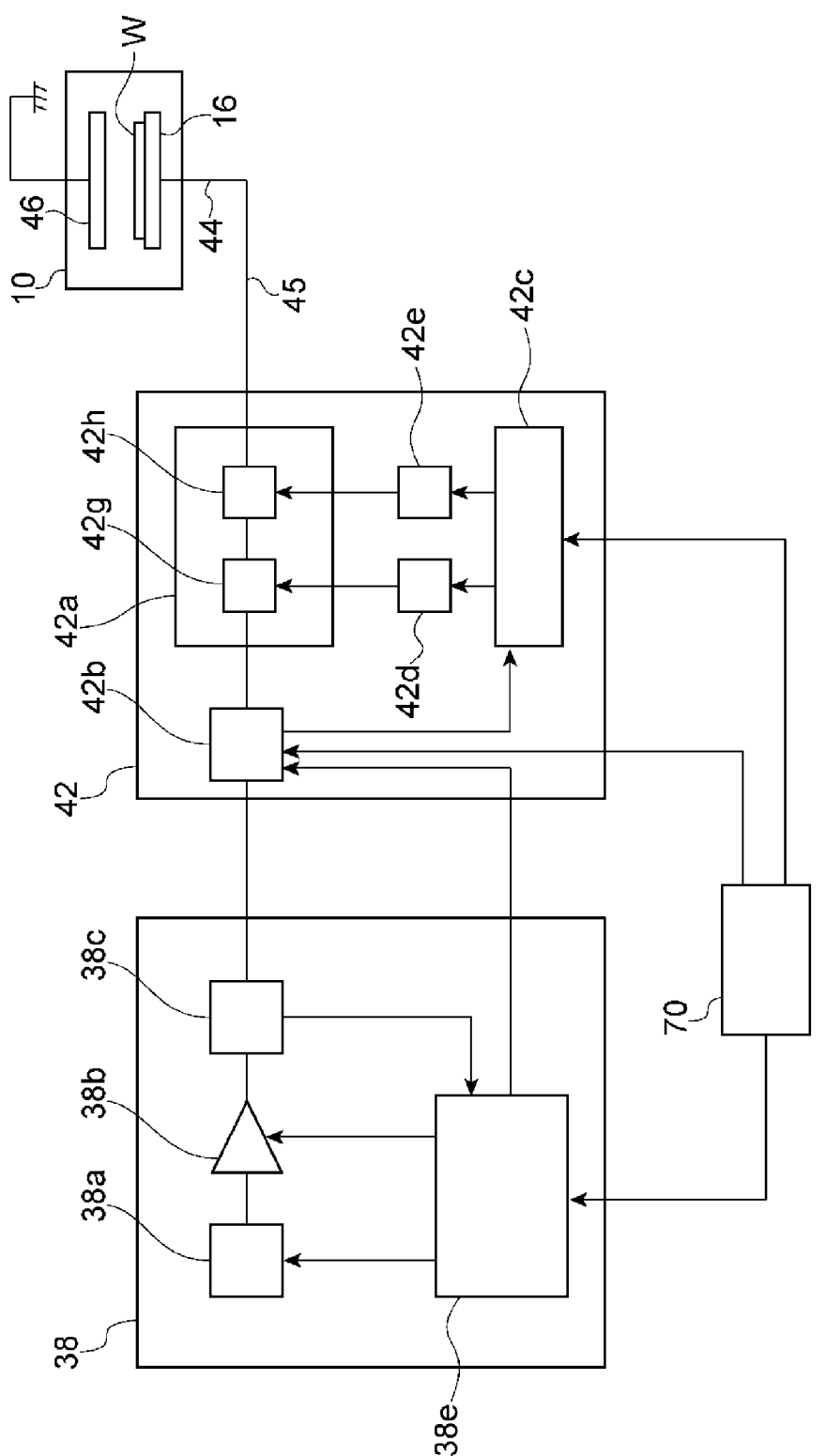
FIG. 6 is a diagram illustrating a configuration example of a second radio-frequency power supply and a second matching device of the plasma processing apparatus illustrated in FIG. 1.
Figure 7:
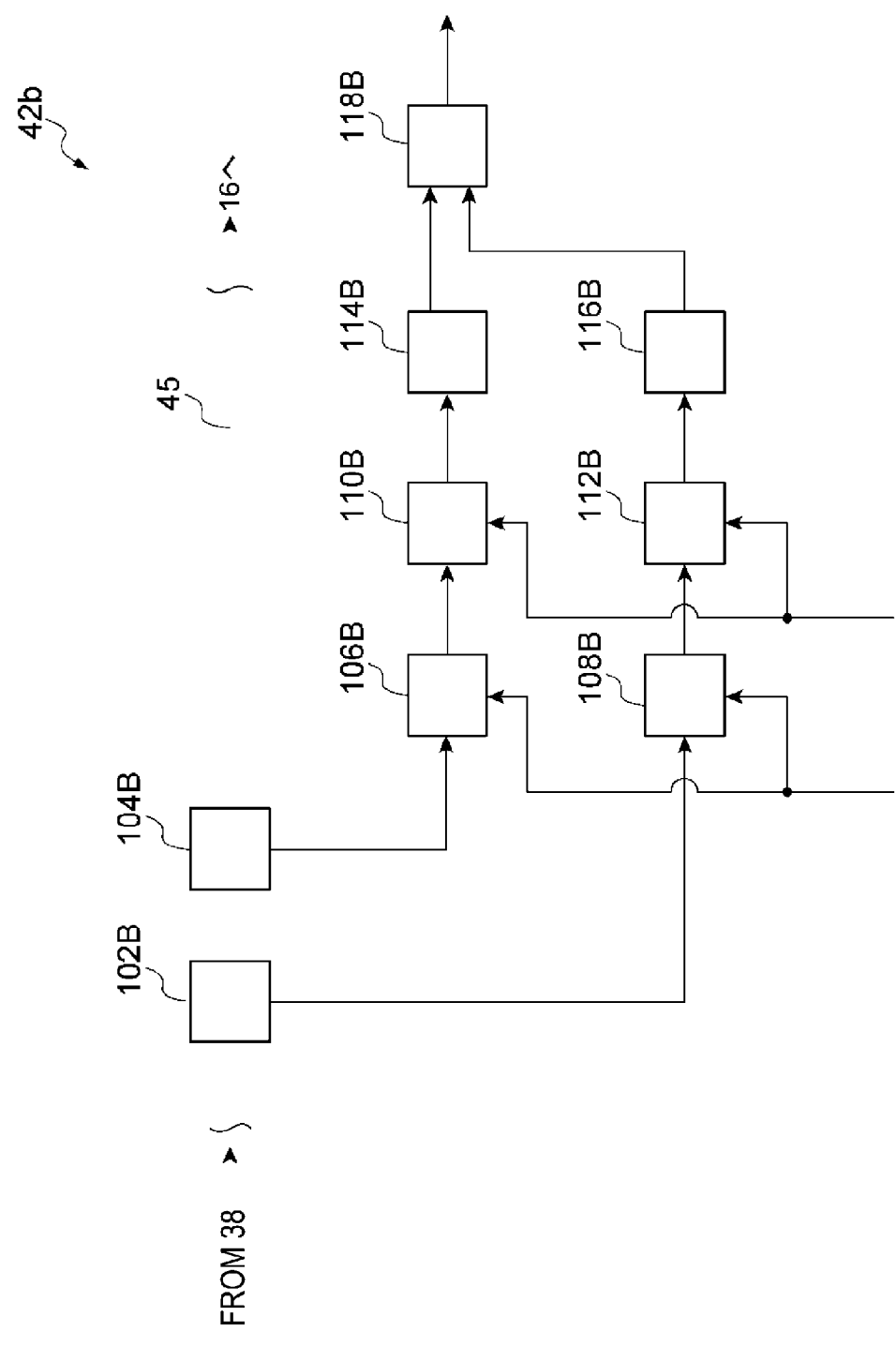
FIG. 7 is a diagram illustrating a configuration example of a sensor of the second matching device of the plasma processing apparatus illustrated in FIG. 1.

Hereinafter, the radio-frequency power supply 36, the matching device 40, the radio-frequency power supply 38, and the matching device 42 will be described in detail with reference to FIGS. 4 to 7. FIG. 4 is a diagram illustrating a configuration example of the first radio-frequency power supply and the first matching device of the plasma processing apparatus illustrated in FIG. 1. FIG. 5 is a diagram illustrating a configuration example of a sensor of the first matching device of the plasma processing apparatus illustrated in FIG. 1. FIG. 6 is a diagram illustrating a configuration example of the second radio-frequency power supply and the second matching device of the plasma processing apparatus illustrated in FIG. 1. FIG. 7 is a diagram illustrating a configuration example of a sensor of the second matching device of the plasma processing apparatus illustrated in FIG. 1.

As illustrated in FIG. 4, in the embodiment, the radio-frequency power supply 36 includes an oscillator 36a, a power amplifier 36b, a power sensor 36c, and a power supply control unit 36e. The power supply control unit 36e includes a processor such as a CPU. The power supply control unit 36e gives a control signal to each of the oscillator 36a, the power amplifier 36b, and the power sensor 36c to control the oscillator 36a, the power amplifier 36b, and the power sensor 36c. The power supply control unit 36e uses the signal given from the main control unit 70 and the signal given from the power sensor 36c to generate a control signal given to each of the oscillator 36a, the power amplifier 36b, and the power sensor 36c.

The signal given from the main control unit 70 to the power supply control unit 36e includes a first frequency setting signal and a mode setting signal. The first frequency setting signal is a signal that designates the set frequency of the radio-frequency power RF1. The mode setting signal is a signal that designates the selected mode from the first to third modes. When the first mode or the second mode is designated, the signal given from the main control unit 70 to the power supply control unit 36e further includes a first modulation setting signal. The first modulation setting signal is a signal that designates the modulation frequency and duty ratio of the modulated wave MW1. The first modulation setting signal is also a signal that designates the power level of the modulated wave MW1 in the first sub-period SP11 and the power level of the modulated wave MW1 in the second sub-period SP12. When the third mode is designated, the signal given from the main control unit 70 to the power supply control unit 36e further includes a first power level setting signal that designates the power of the continuous wave CW1.

The power supply control unit 36e controls the oscillator 36a to output a radio-frequency signal having a set frequency (e.g., the fundamental frequency $f_{B1}$) designated by the first frequency setting signal. The output of the oscillator 36a is connected to the input of the power amplifier 36b. The power amplifier 36b generates radio-frequency power RF1 by amplifying the radio-frequency signal output from the oscillator 36a. The power amplifier 36b is controlled by the power supply control unit 36e.

When the first mode or the second mode is designated, the power supply control unit 36e controls the power amplifier 36b to generate the modulated wave MW1 from the radio-frequency signal in response to the first modulation setting signal during the period P1. When the first mode or the second mode is designated, the power supply control unit 36e controls the power amplifier 36b to generate the continuous wave CW1 from the radio-frequency signal in response to the first power level setting signal during the period P2. When the third mode is designated, the power supply control unit 36e controls the power amplifier 36b to generate the continuous wave CW1 from the radio-frequency signal in response to the first power level setting signal during the period P1 and the period P2.

The power sensor 36c is provided at the rear end of the power amplifier 36b. The power sensor 36c includes a directional coupler, a traveling wave detector, and a reflected wave detector. The directional coupler gives a part of the traveling wave of the radio-frequency power RF1 to the traveling wave detector and the reflected wave to the reflected wave detector. A first frequency specifying signal for specifying the set frequency of the radio-frequency power RF1 is given to the power sensor 36c from the power supply control unit 36e. The traveling wave detector generates a measured value of the power level of a component having the same frequency as the set frequency specified from the first frequency specifying signal among all the frequency components of the traveling wave, that is, a measured value $P_{f11}$ of the power level of the traveling wave. The measured value $P_{f11}$ is given to the power supply control unit 36e.

The first frequency specifying signal is also given to the reflected wave detector from the power supply control unit 36e. The reflected wave detector generates a measured value of the power level of a component having the same frequency as the set frequency specified from the first frequency specifying signal among all the frequency components of the reflected wave, that is, a measured value $P_{r11}$ of the power level of the reflected wave. The measured value $P_{fl1}$ is given to the power supply control unit 36$e$. Further, the reflected wave detector generates a measured value of the total power level of all frequency components of the reflected wave, that is, a measured value $P_{rl2}$ of the power level of the reflected wave. The measured value $P_{rl2}$ is given to the power supply control unit 36$e$ for the protection of the power amplifier 36$b$.

In the embodiment, the radio-frequency power supply 36 may perform a load power control during the period P1. That is, the radio-frequency power supply 36 may adjust the power level of the radio-frequency power RF1 so that the load power level of the radio-frequency power RF1 in the period P1 approaches or matches the specified target power level. The power supply control unit 36$e$ may control the power amplifier 36$b$ in the load power control of the radio-frequency power supply 36.

In the load power control when the first mode or the second mode is designated, the power supply control unit 36$e$ may control the power amplifier 36$b$ to adjust the power level of the modulated wave MW1 in the first sub-period SP11. The power level of the modulated wave MW1 in the first sub-period SP11 is adjusted so that the load power level PL11 in the monitoring period MP1 approaches or matches the specified target power level.

The monitoring period MP1 is a period within the first sub-period SP11. The monitoring period MP1 may be a period that starts after a predetermined time length has elapsed from the start time of the first sub-period SP11. The monitoring period MP1 is designated by the main control unit 70. The load power level $P_{L11}$ is a difference between the power level of the traveling wave of the radio-frequency power RF1 in the monitoring period MP1 and the power level of the reflected wave of the radio-frequency power RF1 in the monitoring period MP1. The load power level $P_{L11}$ is obtained as a difference between the measured value $P_{fl1}$ and the measured value $P_{rl1}$ during the monitoring period MP1. The load power level $P_{L11}$ may be obtained as a difference between the average value of the measured value $P_{fl1}$ and the average value of the measured value $P_{rl1}$ during the monitoring period MP1. Alternatively, the load power level $P_{L11}$ may be obtained as a difference between the moving average value of the measured value $P_{fl1}$ and the moving average value of the measured value $P_{rl1}$ in the plurality of monitoring periods MP1.

When the power level of the modulated wave MW1 in the second sub-period SP12 is not 0 W, the radio-frequency power supply 36 may execute the load power control of the modulated wave MW1 in the second sub-period SP12. In the load power control, the power supply control unit 36$e$ may control the power amplifier 36$b$ to adjust the power level of the modulated wave MW1 in the second sub-period SP12. The power level of the modulated wave MW1 in the second sub-period SP12 is adjusted so that the load power level $P_{L12}$ in the monitoring period MP2 approaches or matches the specified target power level.

The monitoring period MP2 may be a period that coincides with the second sub-period SP12. Alternatively, the monitoring period MP2 may be a period within the second sub-period SP12, and may be a period that starts after a predetermined time length has elapsed from the start time of the second sub-period SP12. The monitoring period MP2 is designated by the main control unit 70. The load power level $P_{L12}$ is a difference between the power level of the traveling wave of the radio-frequency power RF1 in the monitoring period MP2 and the power level of the reflected wave of the radio-frequency power RF1 in the monitoring period MP2.

The load power level $P_{L12}$ is obtained as the difference between the measured value $P_{fl1}$ and the measured value $P_{rl1}$ during the monitoring period MP2. The load power level $P_{L12}$ may be obtained as the difference between the average value of the measured value $P_{fl1}$ and the average value of the measured value $P_{rl1}$ during the monitoring period MP2. Alternatively, the load power level $P_{L12}$ may be obtained as the difference between the moving average value of the measured value $P_{fl1}$ and the moving average value of the measured value $P_{rl1}$ in the plurality of monitoring periods MP2.

The radio-frequency power supply 36 may also perform load power control even when the third mode is designated. In the load power control when the third mode is designated, the power supply control unit 36$e$ may control the power amplifier 36$b$ to adjust the power level of the continuous wave CW1 in the period P1. The power level of the continuous wave CW1 in the period P1 is adjusted so that the average value of the load power level $P_{L11}$ in the monitoring period MP1 and the load power level $P_{L12}$ in the monitoring period MP2 matches or approaches the specified target power level.

The matching device 40 is configured to set the load-side impedance of the radio-frequency power supply 36, that is, the load impedance. In each of the first and second modes, the matching device 40 may set the load impedance of the radio-frequency power supply 36 in the period P1 to a target impedance different from the output impedance of the radio-frequency power supply 36. The load impedance of the radio-frequency power supply 36 in the period P1 may be specified by the measured value of the load impedance of the radio-frequency power supply 36 in the monitoring period MP1.

In the third mode, the matching device 40 may match the load impedance of the radio-frequency power supply 36 in the period P1 with the output impedance of the radio-frequency power supply 36. Alternatively, the matching device 40 sets the load impedance of the radio-frequency power supply 36 in the period P1 to a target impedance different from the output impedance of the radio-frequency power supply 36 in the third mode as well as in the first and second modes.

The matching device 40 matching devices the load impedance of the radio-frequency power supply 36 in the period P2 to the target impedance for the subsequent period PB in each of the first mode and the second mode. That is, the matching device 40 is configured to gradually change the load impedance of the radio-frequency power supply 36 to the target impedance for the subsequent period PB in the period P2 before or after the power generated by the radio-frequency power supply 36 is switched from the power wave W11 to the power wave W12.

Figure 8:
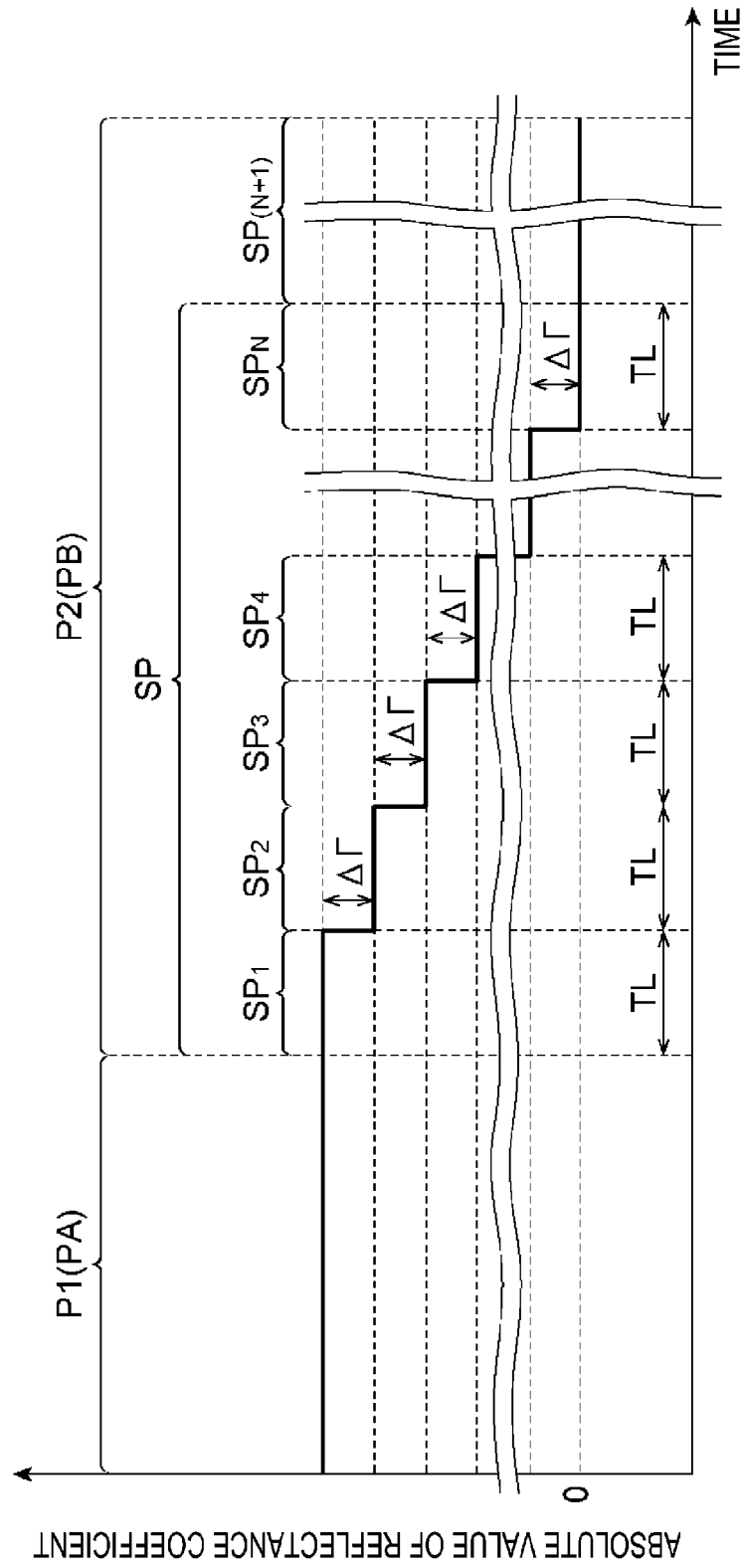
FIG. 8 is a diagram illustrating an example of a change in the absolute value of a reflectance coefficient.
Figure 9:
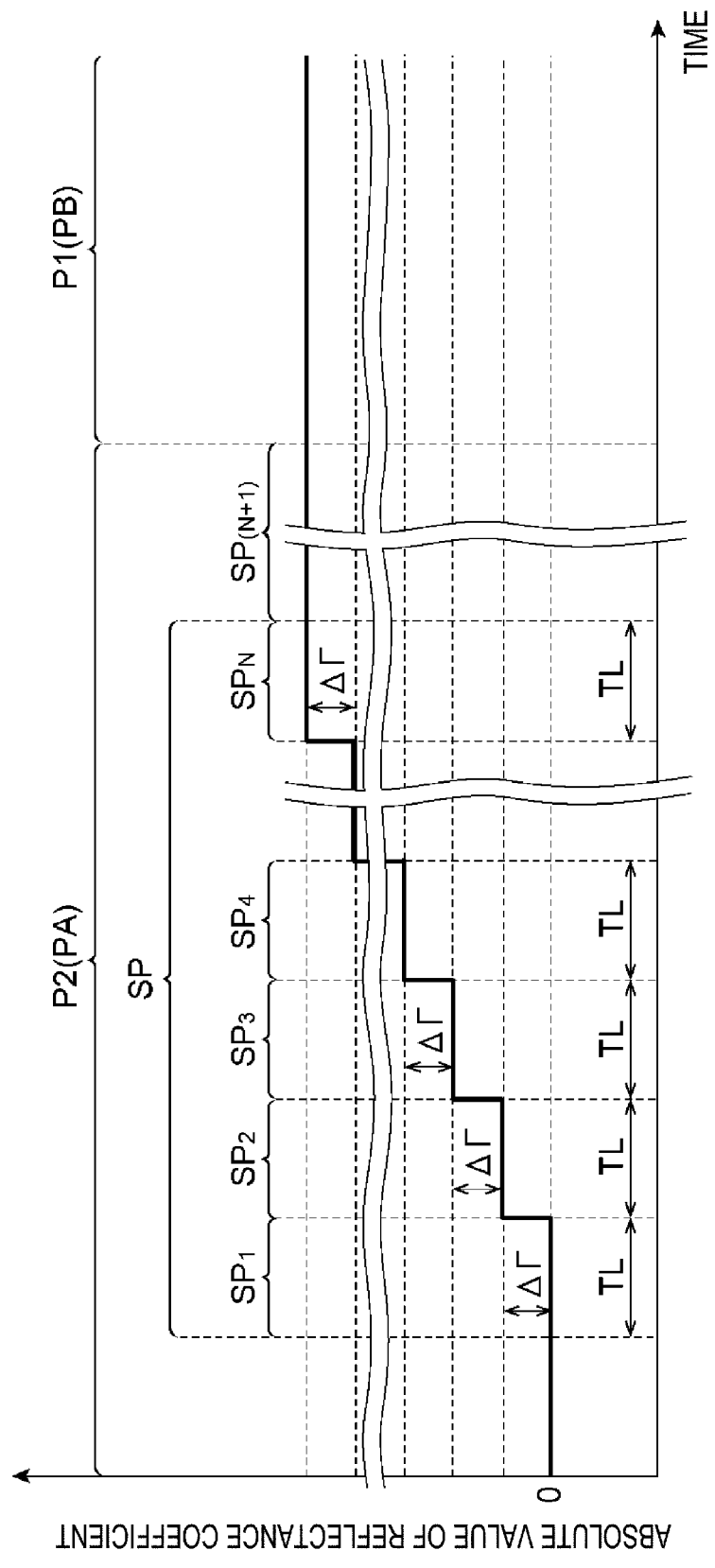
FIG. 9 is a diagram illustrating another example of a change in the absolute value of the reflectance coefficient.

As illustrated in FIGS. 8 and 9, in each of the first and second modes, the matching device 40 gradually changes the load impedance of the radio-frequency power supply 36 so that the absolute value $|\Gamma_1|$ of the reflectance coefficient $\Gamma_1$ is gradually changed to the set target value for the subsequent period PB in the period P2. As illustrated in FIG. 8, when the subsequent period PB is the period P2 in each of the first and second modes, the set target value of the absolute value $|\Gamma_1|$ of the reflectance coefficient $\Gamma_1$ for the subsequent period PB may be zero. As illustrated in FIG. 9, when the subsequent period PB is the period P1 in each of the first and second modes, the set target value of the absolute value $|\Gamma_1|$ of the reflectance coefficient $\Gamma_1$ for the subsequent period PB is larger than zero, for example, 0.3 or more and 0.5 or less.

The period P2 includes a plurality of consecutive sub-period SPs. The plurality of sub-period SPs include sub-periods $SP_1$, $SP_2$, . . . , $SP_N$. The matching device 40 may gradually change the load impedance of the radio-frequency power supply 36 so that the absolute value $|\Gamma_1|$ of the reflectance coefficient $\Gamma_1$ in the period P2 is gradually changed through the sub-periods $SP_1$, $SP_2$, . . . , $SP_N$ to the set target value for the subsequent period PB. As illustrated in FIG. 8, when the subsequent period PB is the period P2, the matching device 40 gradually changes the load imped-ance of the radio-frequency power supply 36 through the sub-periods $SP_1$, $SP_2$, . . . , $SP_N$ in the period P2 after the start of the subsequent period PB (period P2). As illustrated in FIG. 9, when the subsequent period PB is the period P1, the matching device 40 gradually changes the load impedance of the radio-frequency power supply 36 through the sub-periods $SP_1$, $SP_2$, . . . , $SP_N$ in the period P2 before the start of the subsequent period PB (period P1). The period P2 further includes a sub-period $SP_{(N+1)}$. The sub-period $SP_{(N+1)}$ is a period continuous with the sub-period $SP_N$. The matching device 40 sets the load impedance of the radio-frequency power supply 36 so that the absolute value $|\Gamma_1|$ of the reflectance coefficient $\Gamma_1$ in the sub-period $SP_{(N+1)}$ is set as the set target value for the subsequent period PB. Here-inafter, each of the sub-periods $SP_1$, $SP_2$, . . . , $SP_N$, $SP_{(N+1)}$ may be referred to as a sub-period $SP_i$. The symbol "i" refers to an index that is an integer of 1 or more and N+1 or less.

In the third mode, the matching device 40 may match the load impedance of the radio-frequency power supply 36 in the period P2 with the output impedance of the radio-frequency power supply 36. The matching device 40 may gradually change the load impedance of the radio-frequency power supply 36 in the period P2 to the target impedance for the subsequent period PB in the third mode as well as in the first and second modes.

In the embodiment, as illustrated in FIG. 4, the matching device 40 includes a matching circuit 40a, a sensor 40b, a controller 40c, an actuator 40d, and an actuator 40e. The matching circuit 40a may include a variable reactance element 40g and a variable reactance element 40h. Each of the variable reactance element 40g and the variable reac-tance element 40h is, for example, a variable capacitor. The matching circuit 40a may further include an inductor and the like.

The controller 40c operates under the control of the main control unit 70. The controller 40c adjusts the load imped-ance of the radio-frequency power supply 36 according to the measured value of the load-side impedance (i.e., the load impedance) of the radio-frequency power supply 36 given by the sensor 40b. The controller 40c adjusts the load impedance of the radio-frequency power supply 36 by controlling the actuator 40d and the actuator 40e and adjust-ing the reactance of each of the variable reactance element 40g and the variable reactance element 40h. The actuator 40d and the actuator 40e are, for example, motors.

The sensor 40b is configured to acquire a measured value of the load impedance of the radio-frequency power supply 36. In the embodiment, the measured value of the load impedance of the radio-frequency power supply 36 is acquired as a moving average value. As illustrated in FIG. 5, the sensor 40b may include a current detector 102A, a voltage detector 104A, filters 106A and 108A, average value calculators 110A and 112A, moving average value calcula-tors 114A and 116A, and an impedance calculator 118A.

The voltage detector 104A detects the voltage waveform of the radio-frequency power RF1 transmitted on the power feeding line 43, and outputs a voltage waveform analog signal representing the voltage waveform. This voltage waveform analog signal is input to the filter 106A. The filter 106A generates a voltage waveform digital signal by digi-tizing the input voltage waveform analog signal. The filter 106A receives the above-mentioned first frequency specify-ing signal from the power supply control unit 36e and extracts only the frequency component corresponding to the frequency specified by the first frequency specifying signal from the voltage waveform digital signal, thereby generating a filtration voltage waveform signal. The filter 106A may be composed of an FPGA (Field Programmable Gate Array).

The filtration voltage waveform signal generated by the filter 106A is output to the average value calculator 110A. The average value calculator 110A receives a monitoring period setting signal from the main control unit 70. The average value calculator 110A obtains the average value of the voltage within the period specified from the monitoring period setting signal from the filtration voltage waveform signal. The average value calculator 110A obtains the aver-age value $V_{A11}$ of the voltage in each monitoring period MP1 as the average value of the voltage. When the third mode is designated, the average value calculator 110A may further obtain the average value $V_{A12}$ of the voltage in each moni-toring period MP2 as the average value of the voltage. Further, the average value calculator 110A may be com-posed of, for example, an FPGA.

The moving average value calculator 114A obtains the moving average value $V_{MA11}$ of the average value VAI which is obtained from the voltage of the radio-frequency power RF1 in the latest and predetermined number of monitoring periods MP1 among the plurality of average values $V_{A11}$ already obtained. The moving average value $V_{MA11}$ is output to the impedance calculator 118A.

In the third mode, the moving average value calculator 114A may further obtain the moving average value $V_{MA12}$ of the average value $V_{A12}$ which is obtained from the voltage of the radio-frequency power RF1 in the latest and prede-termined number of monitoring periods MP2 among the plurality of average values $V_{A12}$ already obtained. The moving average value $V_{MA12}$ is output to the impedance calculator 118A.

The current detector 102A detects the current waveform of the radio-frequency power RF1 transmitted on the power feeding line 43, and outputs a current waveform analog signal representing the current waveform. This voltage waveform analog signal is input to the filter 108A. The filter 108A generates a voltage waveform digital signal by digi-tizing the input voltage waveform analog signal. The filter 108A receives the above-mentioned first frequency specify-ing signal from the power supply control unit 36e and extracts only the frequency component corresponding to the frequency specified by the first frequency specifying signal from the voltage waveform digital signal, thereby generating a filtration voltage waveform signal. The filter 108A may be composed of an FPGA.

The filtration voltage waveform signal generated by the filter 108A is output to the average value calculator 112A. The average value calculator 112A receives a monitoring period setting signal from the main control unit 70. The average value calculator 112A obtains the average value of the voltage within the period specified from the monitoring period setting signal from the filtration voltage waveform signal. The average value calculator 112A obtains the aver-age value $I_{A11}$ of the current in the monitoring period MP1 in each period P1 as the average value of the current. When the third mode is designated, the average value calculator 112A may further obtain the average value $I_{A12}$ of the current in each monitoring period MP2 as the average value of the current. Further, the average value calculator 112A may be composed of, for example, an FPGA.

The moving average value calculator 116A obtains the moving average value $I_{MA11}$ of the average value $I_{A11}$ which is obtained from the current of the radio-frequency power RF1 in the latest and predetermined number of monitoring periods MP1 among the plurality of average values $I_{A11}$ already obtained. The moving average value $I_{MA11}$ is output to the impedance calculator 118A.

In the third mode, the moving average value calculator 116A may further obtain the moving average value $I_{MA12}$ of the average value $I_{A12}$ which is obtained from the current of the radio-frequency power RF1 in the latest and predetermined number of monitoring periods MP2 among the plurality of average values $I_{A12}$ already obtained. The moving average value $I_{MA12}$ is output to the impedance calculator 118A.

The impedance calculator 118A obtains the moving average value $Z_{MA11}$ of the load impedance of the radio-frequency power supply 36 from the moving average value $I_{MA11}$ and the moving average value $V_{MA11}$. The moving average value $Z_{MA11}$ is a measured value of the load impedance of the radio-frequency power supply 36 during the monitoring period MP1. In the third mode, the impedance calculator 118A may further obtain the moving average value $Z_{MA12}$ of the load impedance of the radio-frequency power supply 36 from the moving average value $I_{MA12}$ and the moving average value $V_{MA12}$. The moving average value $Z_{MA12}$ is a measured value of the load impedance of the radio-frequency power supply 36 during the monitoring period MP2.

The controller 40c controls the matching circuit 40a in order to set the load impedance of the radio-frequency power supply 36. In the embodiment, the controller 40c sets the load impedance of the radio-frequency power supply 36 by adjusting the reactances of the variable reactance element 40g and the variable reactance element 40h through the actuator 40d and the actuator 40e.

In each of the first and second modes, the controller 40c adjusts the load impedance of the radio-frequency power supply 36 in the period P1 specified by the moving average value $Z_{MA11}$ to a target impedance different from the output impedance of the radio-frequency power supply 36.

In the embodiment, the controller 40c may specify the target impedance from the set target value of the absolute value $|\Gamma_1|$ of the reflectance coefficient $\Gamma_1$ of the radio-frequency power RF1 in the period P1. The set target value of the absolute value $|\Gamma_1|$ in the period P1 may be a value larger than 0. For example, the set target value of the absolute value $|\Gamma_1|$ in the period P1 is 0.3 or more and 0.5 or less. The reflectance coefficient $\Gamma_1$ is defined by the following equation (1).

$$\Gamma_1 = (Z_1 - Z_{01})/(Z_1 + Z_{01}) \tag{1}$$

In the equation (1), $Z_{01}$ is the characteristic impedance of the power feeding line 43, and is generally 50Ω. In the equation (1), $Z_1$ is the target impedance. The controller 40c determines the target impedance $Z_1$ corresponding to the set target value of the absolute value $|\Gamma_1|$ in the period P1 based on the equation (1). The controller 40c sets the load impedance of the radio-frequency power supply 36 so that the load impedance of the radio-frequency power supply 36 during the period P1 specified by the moving average value $Z_{MA11}$ approaches or matches the target impedance $Z_1$.

When the third mode is specified, the controller 40c may match the load impedance of the radio-frequency power supply 36 with the output impedance (matching point) of the radio-frequency power supply 36 during the period P1. The load impedance of the radio-frequency power supply 36 may be specified by the average value of the moving average value $Z_{MA11}$ and the moving average value $Z_{MA12}$. Alternatively, the controller 40c may adjust the load impedance of the radio-frequency power supply 36 in the period P1 to a target impedance different from the output impedance of the radio-frequency power supply 36 in the third mode as well as in the first and second modes.

As described above, in each of the first and second modes, the matching device 40 may gradually change the load impedance of the radio-frequency power supply 36 so that the absolute value $|\Gamma_1|$ of the reflectance coefficient $\Gamma_1$ is gradually changed to the set target value for the subsequent period PB. As described above, the matching device 40 gradually changes the load impedance of the radio-frequency power supply 36 through a plurality of sub-period SPs in the period P2. The time length of each of the plurality of sub-period SPs (i.e., $SP_1$, $SP_2$, ..., $SP_N$) is TL.

The target values of the absolute value $|\Gamma_1|$ of the reflectance coefficient $\Gamma_1$ of the radio-frequency power RF1 in the plurality of sub-periods $SP_1$, $SP_2$, ..., $SP_N$ are different from each other. Of any two consecutive sub-periods included in the plurality of sub-periods SP2, the difference between the target value of the absolute value $|\Gamma_1|$ of the reflectance coefficient $\Gamma_1$ in one sub-period and the target value of the absolute value $|\Gamma_1|$ of the reflectance coefficient $\Gamma_1$ in the other period is $\Delta\Gamma_1$. In addition, FIG. 8 and FIG. 9 illustrate $\Delta\Gamma_1$ as $\Delta\Gamma$. As illustrated in FIG. 8, when the subsequent period PB is the period P2, the target value of the absolute value $|\Gamma_1|$ of the reflectance coefficient $\Gamma_1$ in the sub-period $SP_{(N+1)}$, that is, the set target value is zero. As illustrated in FIG. 9, when the subsequent period PB is the period P1, the target value of the absolute value $|\Gamma_1|$ of the reflectance coefficient $\Gamma_1$ in the sub-period $SP_{(N+1)}$, that is, the set target value is larger than zero, for example, 0.3 or more and 0.5 or less. In the embodiment, the TL may be set to 0.5 seconds or more and the $\Delta\Gamma_1$ may be set to 0.2 or less. Further, the TL may be set to 0.2 seconds or more and the $\Delta\Gamma_1$ may be set to 0.1 or less. In addition, the TL may be set to 0.5 seconds or more and the $\Delta\Gamma_1$ may be set to 0.05 or less.

The controller 40c sets the load impedance of the radio-frequency power supply 36. Specifically, the controller 40c adjusts the load impedance of the radio-frequency power supply 36 in the sub-period $SP_i$ from the target value of the absolute value $|\Gamma_1|$ of the reflectance coefficient $\Gamma_1$ of the radio-frequency power RF1 in the sub-period $SP_i$ to the target impedance $Z_1$ specified based on the equation (1). Further, the controller 40c may specify the load impedance of the radio-frequency power supply 36 in the sub-period $SP_i$ from the measured value of the load impedance of the radio-frequency power supply 36 obtained by the sensor 40b. The sensor 40b may obtain the measured value of the load impedance of the radio-frequency power supply 36 from the above-mentioned filtration voltage waveform signal and filtration current waveform signal.

When the third mode is specified, the controller 40c may match the load impedance of the radio-frequency power supply 36 with the output impedance (matching point) of the radio-frequency power supply 36 during the period P2. In the third mode as well as in the first and second modes, the controller 40c may gradually change the load impedance of the radio-frequency power supply 36 to the target impedance for the subsequent period PB in the period P2.

As illustrated in FIG. 6, in the embodiment, the radio-frequency power supply 38 includes an oscillator 38a, a power amplifier 38b, a power sensor 38c, and a power supply control unit 38e. The power supply control unit 38e includes a processor such as a CPU. The power supply control unit 38e gives a control signal to each of the oscillator 38a, the power amplifier 38b, and the power sensor 38c to control the oscillator 38a, the power amplifier 38b, and the power sensor 38c. The power supply control unit 38e uses the signal given from the main control unit 70 and the signal given from the power sensor 38c to generate a control signal given to each of the oscillator 38a, the power amplifier 38b, and the power sensor 38c.

The signal given from the main control unit 70 to the power supply control unit 38e includes a second frequency setting signal and the above-mentioned mode setting signal. The second frequency setting signal designates the set frequency of the radio-frequency power RF2. When the first mode or the third mode is designated, the signal given from the main control unit 70 to the power supply control unit 38e further includes a second modulation setting signal. The second modulation setting signal designates the modulation frequency and duty ratio of the modulated wave MW2. Further, the second modulation setting signal is also a signal that designates the power level of the modulated wave MW2 in the first sub-period SP11 and the power level of the modulated wave MW2 in the second sub-period SP12. In the first mode, the modulation frequency of the modulated wave MW1 and the modulation frequency of the modulated wave MW2 may be the same as each other. When the second mode is designated, the signal given from the main control unit 70 to the power supply control unit 38e further includes a second power level setting signal that designates the power of the continuous wave CW2.

The power supply control unit 38e controls the oscillator 38a to output a radio-frequency signal having a set frequency (e.g., the fundamental frequency $f_{B2}$) designated by the second frequency setting signal. The output of the oscillator 38a is connected to the input of the power amplifier 38b. The power amplifier 38b generates radio-frequency power RF2 by amplifying the radio-frequency signal output from the oscillator 38a. The power amplifier 38b is controlled by the power supply control unit 38e.

When the first mode or the third mode is designated, the power supply control unit 38e controls the power amplifier 38b to generate the modulated wave MW2 from the radio-frequency signal in response to the second modulation setting signal during the period P1. When the first mode or the third mode is designated, the power supply control unit 38e controls the power amplifier 38b to generate the continuous wave CW2 from the radio-frequency signal in response to the second power level setting signal during the period P2. When the second mode is designated, the power supply control unit 38e controls the power amplifier 38b to generate the continuous wave CW2 from the radio-frequency signal in response to the second power level setting signal during the period P1 and the period P2.

The power sensor 38c is provided at the rear end of the power amplifier 38b. The power sensor 38c includes a directional coupler, a traveling wave detector, and a reflected wave detector. The directional coupler gives a part of the traveling wave of the radio-frequency power RF2 to the traveling wave detector and the reflected wave to the reflected wave detector. A second frequency specifying signal for specifying the set frequency of the radio-frequency power RF2 is given to the power sensor 38c from the power supply control unit 38e. The traveling wave detector generates a measured value of the power level of a component having the same frequency as the set frequency specified from the second frequency specifying signal among all the frequency components of the traveling wave, that is, a measured value $P_{f21}$ of the power level of the traveling wave. The measured value $P_{f21}$ is given to the power supply control unit 38e.

The second frequency specifying signal is also given to the reflected wave detector from the power supply control unit 38e. The reflected wave detector generates a measured value of the power level of a component having the same frequency as the set frequency specified from the second frequency specifying signal among all the frequency components of the reflected wave, that is, a measured value $P_{r21}$ of the power level of the reflected wave. The measured value $P_{r21}$ is given to the power supply control unit 38e. Further, the reflected wave detector generates a measured value of the total power level of all frequency components of the reflected wave, that is, a measured value $P_{r22}$ of the power level of the reflected wave. The measured value $P_{r22}$ is given to the power supply control unit 38e for the protection of the power amplifier 38b.

In the embodiment, the radio-frequency power supply 38 may perform a load power control during the period P1. That is, the radio-frequency power supply 38 may adjust the power level of the radio-frequency power RF2 so that the load power level of the radio-frequency power RF2 in the period P1 approaches or matches the specified target power level. The power supply control unit 38e may control the power amplifier 38b in the load power control of the radio-frequency power supply 38.

In the load power control when the first mode or the third mode is designated, the power supply control unit 38e may control the power amplifier 38b to adjust the power level of the modulated wave MW2 in the first sub-period SP11. The power level of the modulated wave MW2 in the first sub-period SP11 is adjusted so that the load power level PL21 in the monitoring period MP1 approaches or matches the specified target power level.

As described above, the monitoring period MP1 is a period within the first sub-period SP11. The monitoring period MP1 may be a period that starts after a predetermined time length has elapsed from the start time of the first sub-period SP11. The monitoring period MP1 is designated by the main control unit 70. The load power level $P_{L21}$ is a difference between the power level of the traveling wave of the radio-frequency power RF2 in the monitoring period MP1 and the power level of the reflected wave of the radio-frequency power RF2 in the monitoring period MP1. The load power level $P_{L21}$ is obtained as the difference between the measured value $P_{f21}$ and the measured value $P_{r21}$ during the monitoring period MP1. The load power level $P_{L21}$ may be obtained as the difference between the average value of the measured value $P_{f21}$ and the average value of the measured value $P_{r21}$ during the monitoring period MP1. Alternatively, the load power level $P_{L21}$ may be obtained as the difference between the moving average value of the measured value $P_{f21}$ and the moving average value of the measured value $P_{r21}$ in the plurality of monitoring periods MP1.

When the power level of the modulated wave MW2 in the second sub-period SP12 is not 0 W, the radio-frequency power supply 38 may execute the load power control of the modulated wave MW2 in the second sub-period SP12. In the load power control, the power supply control unit 38e may control the power amplifier 38b to adjust the power level of the modulated wave MW2 in the second sub-period SP12. The power level of the modulated wave MW2 in the second sub-period SP12 is adjusted so that the load power level PL22 in the monitoring period MP2 approaches or matches the specified target power level.

As described above, the monitoring period MP2 may be a period that coincides with the second sub-period SP12. Alternatively, the monitoring period MP2 may be a period within the second sub-period SP12, and may be a period that starts after a predetermined time length has elapsed from the start time of the second sub-period SP12. The monitoring period MP2 is designated by the main control unit 70. The load power level $P_{L22}$ is a difference between the power level of the traveling wave of the radio-frequency power RF2 in the monitoring period MP2 and the power level of the reflected wave of the radio-frequency power RF2 in the monitoring period MP2. The load power level $P_{L22}$ is obtained as the difference between the measured value $P_{f21}$ and the measured value $P_{r21}$ during the monitoring period MP2. The load power level $P_{L22}$ may be obtained as the difference between the average value of the measured value $P_{f21}$ and the average value of the measured value $P_{r21}$ during the monitoring period MP2. Alternatively, the load power level $P_{L22}$ may be obtained as the difference between the moving average value of the measured value $P_{f21}$ and the moving average value of the measured value $P_{r21}$ in the plurality of monitoring periods MP2.

The radio-frequency power supply 38 may also perform a load power control even when the second mode is designated. In the load power control when the second mode is designated, the power supply control unit 38*e* may control the power amplifier 38*b* to adjust the power level of the continuous wave CW2 in the period P1. The power level of the continuous wave CW2 in the period P1 is adjusted so that the average value of the load power level $P_{L21}$ in the monitoring period MP1 and the load power level $P_{L22}$ in the monitoring period MP2 matches or approaches the specified target power level.

The matching device 42 is configured to set the load-side impedance of the radio-frequency power supply 38, that is, the load impedance. In each of the first and second modes, the matching device 42 may set the load impedance of the radio-frequency power supply 38 in the period P1 to a target impedance different from the output impedance of the radio-frequency power supply 38. The load impedance of the radio-frequency power supply 38 in the period P1 may be specified by the measured value of the load impedance of the radio-frequency power supply 38 in the monitoring period MP1.

In the second mode, the matching device 42 may match the load impedance of the radio-frequency power supply 38 in the period P1 with the output impedance of the radio-frequency power supply 38. Alternatively, the matching device 42 sets the load impedance of the radio-frequency power supply 38 in the period P1 to a target impedance different from the output impedance of the radio-frequency power supply 38 in the second mode as well as in the first and third modes.

The matching device 42 gradually changes the load impedance of the radio-frequency power supply 38 in the period P2 to the target impedance for the subsequent period PB in each of the first mode and the third mode. That is, the matching device 42 is configured to gradually change the load impedance of the radio-frequency power supply 38 to the target impedance for the subsequent period PB in the period P2 before or after the power generated by the radio-frequency power supply 38 is switched from the power wave W21 to the power wave W22.

As illustrated in FIGS. 8 and 9, in each of the first and third modes, the matching device 42 gradually changes the load impedance of the radio-frequency power supply 38 so that the absolute value $|\Gamma_2|$ of the reflectance coefficient $\Gamma_2$ is gradually changed to the set target value for the subsequent period PB in the period P2. As illustrated in FIG. 8, when the subsequent period PB is the period P2 in each of the first and third modes, the set target value of the absolute value $|\Gamma_2|$ of the reflectance coefficient $\Gamma_2$ for the subsequent period PB may be zero. As illustrated in FIG. 9, when the subsequent period PB is the period P1 in each of the first and third modes, the set target value of the absolute value $|\Gamma_2|$ of the reflectance coefficient $\Gamma_2$ for the subsequent period PB is larger than zero, for example, 0.3 or more and 0.5 or less.

As described above, the subsequent period PB includes a plurality of consecutive sub-period SPs. As described above, the plurality of sub-period SPs include sub-periods $SP_1$, $SP_2$, . . . , $SP_N$. The matching device 42 may gradually change the load impedance of the radio-frequency power supply 38 so that the absolute value $|\Gamma_2|$ of the reflectance coefficient $\Gamma_2$ in the period P2 is gradually changed through the sub-periods $SP_1$, $SP_2$, . . . , $SP_N$ to the set target value for the subsequent period PB. As illustrated in FIG. 8, when the subsequent period PB is the period P2, the matching device 42 gradually changes the load impedance of the radio-frequency power supply 38 through the sub-periods $SP_1$, $SP_2$, . . . , $SP_N$ in the period P2 after the start of the subsequent period PB (period P2). As illustrated in FIG. 9, when the subsequent period PB is the period P1, the matching device 42 gradually changes the load impedance of the radio-frequency power supply 38 through the sub-periods $SP_1$, $SP_2$, . . . , $SP_N$ in the period P2 before the start of the subsequent period PB (period P1). The matching device 42 sets the load impedance of the radio-frequency power supply 38 so that the absolute value $|\Gamma_2|$ of the reflectance coefficient $\Gamma_2$ in the sub-period $SP_{(N+1)}$ is set as the set target value for the subsequent period PB.

In the second mode, the matching device 42 may match the load impedance of the radio-frequency power supply 38 in the period P2 with the output impedance of the radio-frequency power supply 38. Further, the matching device 42 may gradually change the load impedance of the radio-frequency power supply 38 in the period P2 to the target impedance for the subsequent period PB in the second mode as well as in the first and third modes.

In the embodiment, the matching device 42 includes a matching circuit 42*a*, a sensor 42*b*, a controller 42*c*, an actuator 42*d*, and an actuator 42*e*, as illustrated in FIG. 6. The matching circuit 42*a* may include a variable reactance element 42*g* and a variable reactance element 42*h*. Each of the variable reactance element 42*g* and the variable reactance element 42*h* is, for example, a variable capacitor. In addition, the matching circuit 42*a* may further include an inductor and the like.

The controller 42*c* operates under the control of the main control unit 70. The controller 42*c* adjusts the load impedance of the radio-frequency power supply 38 according to the measured value of the load-side impedance (i.e., the load impedance) of the radio-frequency power supply 38 given by the sensor 42*b*. The controller 42*c* adjusts the load impedance of the radio-frequency power supply 38 by controlling the actuator 42*d* and the actuator 42*e* and adjusting the reactance of each of the variable reactance element 42*g* and the variable reactance element 42*h*. The actuator 42*d* and the actuator 42*e* are, for example, motors.

The sensor 42*b* is configured to acquire a measured value of the load impedance of the radio-frequency power supply 38. In the embodiment, the measured value of the load impedance of the radio-frequency power supply 38 is acquired as a moving average value. As illustrated in FIG. 7, the sensor 42b may include a current detector 102B, a voltage detector 104B, filters 106B and 108B, average value calculators 110B and 112B, moving average value calculators 114B and 116B, and an impedance calculator 118B.

The voltage detector 104A detects the voltage waveform of the radio-frequency power RF2 transmitted on the power feeding line 45, and outputs a voltage waveform analog signal representing the voltage waveform. This voltage waveform analog signal is input to the filter 106B. The filter 106B generates a voltage waveform digital signal by digitizing the input voltage waveform analog signal. The filter 106B receives the above-mentioned second frequency specifying signal from the power supply control unit 38e and extracts only the frequency component corresponding to the frequency specified by the second frequency specifying signal from the voltage waveform digital signal, thereby generating a filtration voltage waveform signal. The filter 106B may be composed of an FPGA.

The filtration voltage waveform signal generated by the filter 106A is output to the average value calculator 110B. The average value calculator 110B receives a monitoring period setting signal from the main control unit 70. The average value calculator 110B obtains the average value of the voltage within the period specified from the monitoring period setting signal from the filtration voltage waveform signal. The average value calculator 110B obtains the average value $V_{B11}$ of the voltage in each monitoring period MP1 as the average value of the voltage. When the second mode is designated, the average value calculator 110B may further obtain the average value $V_{B12}$ of the voltage in each monitoring period MP2 as the average value of the voltage. Further, the average value calculator 110B may be composed of, for example, an FPGA.

The moving average value calculator 114B obtains the moving average value $V_{MB11}$ of the average value $V_{B11}$ which is obtained from the voltage of the radio-frequency power RF2 in the latest and predetermined number of monitoring periods MP1 among the plurality of average values $V_{B11}$ already obtained. The moving average value $V_{MB11}$ is output to the impedance calculator 118B.

In the second mode, the moving average value calculator 114B may further obtain the moving average value $V_{MB12}$ of the average value $V_{B12}$ which is obtained from the voltage of the radio-frequency power RF2 in the latest and predetermined number of monitoring periods MP2 among the plurality of average values $V_{B12}$ already obtained. The moving average value $V_{MB12}$ is output to the impedance calculator 118B.

The current detector 102B detects the current waveform of the radio-frequency power RF2 transmitted on the power feeding line 45, and outputs a current waveform analog signal representing the current waveform. This voltage waveform analog signal is input to the filter 108B. The filter 108B generates a voltage waveform digital signal by digitizing the input voltage waveform analog signal. The filter 108B receives the above-mentioned second frequency specifying signal from the power supply control unit 38e and extracts only the frequency component corresponding to the frequency specified by the second frequency specifying signal from the voltage waveform digital signal, thereby generating a filtration voltage waveform signal. The filter 108B may be composed of an FPGA.

The filtration voltage waveform signal generated by the filter 108B is output to the average value calculator 112B. The average value calculator 112B receives a monitoring period setting signal from the main control unit 70. The average value calculator 112B obtains the average value of the current within the period specified from the monitoring period setting signal from the filtration current waveform signal. The average value calculator 112B obtains the average value $I_{B11}$ of the current in the monitoring period MP1 in each period P1 as the average value of the current. When the second mode is designated, the average value calculator 112B may further obtain the average value $I_{B12}$ of the current in each monitoring period MP2 as the average value of the current. Further, the average value calculator 112B may be composed of, for example, an FPGA.

The moving average value calculator 116B obtains the moving average value $I_{MB11}$ of the average value $I_{B11}$ which is obtained from the current of the radio-frequency power RF2 in the latest and predetermined number of monitoring periods MP1 among the plurality of average values $I_{B11}$ already obtained. The moving average value $I_{MB11}$ is output to the impedance calculator 118B.

In the second mode, the moving average value calculator 116B may further obtain the moving average value $I_{MB12}$ of the average value $I_{B12}$ which is obtained from the current of the radio-frequency power RF2 in the latest and predetermined number of monitoring periods MP2 among the plurality of average values $I_{B12}$ already obtained. The moving average value $I_{MB12}$ is output to the impedance calculator 118B.

The impedance calculator 118A obtains the moving average value $Z_{MB11}$ of the load impedance of the radio-frequency power supply 38 from the moving average value $I_{MB11}$ and the moving average value $V_{MB11}$. The moving average value $Z_{MB11}$ is a measured value of the load impedance of the radio-frequency power supply 38 during the monitoring period MP1. In the second mode, the impedance calculator 118B may further obtain the moving average value $Z_{MB12}$ of the load impedance of the radio-frequency power supply 38 from the moving average value $I_{MB12}$ and the moving average value $V_{MB12}$. The moving average value $Z_{MB12}$ is a measured value of the load impedance of the radio-frequency power supply 38 during the monitoring period MP2.

The controller 42c controls the matching circuit 42a in order to set the load impedance of the radio-frequency power supply 38. In the embodiment, the controller 42c sets the load impedance of the radio-frequency power supply 38 by adjusting the reactances of the variable reactance element 42g and the variable reactance element 42h through the actuator 42d and the actuator 42e.

In each of the first and third modes, the controller 42c adjusts the load impedance of the radio-frequency power supply 38 in the period P1 specified by the moving average value $Z_{MB11}$ to a target impedance different from the output impedance of the radio-frequency power supply 38.

In the embodiment, the controller 42c may specify the target impedance from the set target value of the absolute value $|\Gamma_2|$ of the reflectance coefficient $\Gamma_2$ of the radio-frequency power RF2 in the period P1. The set target value of the absolute value $|\Gamma_2|$ in the period P1 may be a value larger than 0. For example, the set target value of the absolute value $|\Gamma_2|$ in the period P1 is 0.3 or more and 0.5 or less. The reflectance coefficient $\Gamma_2$ is defined by the following equation (2).

$$\Gamma_2=(Z_2-Z_{02})/(Z_2+Z_{02}) \tag{2}$$

In the equation (2), $Z_{02}$ is the characteristic impedance of the power feeding line 45, and is generally 50Ω. In the equation (2), $Z_2$ is the target impedance. The controller 42c determines the target impedance $Z_2$ corresponding to the set target value of the absolute value $|\Gamma_2|$ in the period P1 based on the equation (2). The controller 42c sets the load impedance of the radio-frequency power supply 38 so that the load impedance of the radio-frequency power supply 38 during the period P1 specified by the moving average value $Z_{MB11}$ approaches or matches the target impedance $Z_2$.

When the second mode is designated, the controller 42c may match the load impedance of the radio-frequency power supply 38 with the output impedance (matching point) of the radio-frequency power supply 38 during the period P1. The load impedance of the radio-frequency power supply 38 may be specified by the average value of the moving average value $Z_{MB11}$ and the moving average value $Z_{MB12}$. Alternatively, the controller 42c may adjust the load impedance of the radio-frequency power supply 38 in the period P1 to a target impedance different from the output impedance of the radio-frequency power supply 38 in the second mode as well as in the first and third modes.

As described above, in each of the first and third modes, the matching device 42 may gradually change the load impedance of the radio-frequency power supply 38 so that the absolute value $|\Gamma_2|$ of the reflectance coefficient $\Gamma_2$ is gradually changed to the set target value for the subsequent period PB. As described above, the matching device 42 gradually changes the load impedance of the radio-frequency power supply 38 through a plurality of sub-periods SPs in the period P2.

The target values of the absolute value $|\Gamma_2|$ of the reflectance coefficient $\Gamma_2$ of the radio-frequency power RF2 in the plurality of sub-periods $SP_1$, $SP_2$, . . . , $SP_N$ are different from each other. Of any two consecutive sub-periods included in the plurality of sub-periods SP2, the difference between the target value of the absolute value $|\Gamma_2|$ of the reflectance coefficient $\Gamma_2$ in one sub-period and the target value of the absolute value $|\Gamma_2|$ of the reflectance coefficient $\Gamma_2$ in the other period is $\Delta\Gamma_2$. In addition, FIG. 8 and FIG. 9 illustrate $\Delta\Gamma_2$ as $\Delta\Gamma$. As illustrated in FIG. 8, when the subsequent period PB is the period P2, the target value of the absolute value $|\Gamma_2|$ of the reflectance coefficient $\Gamma_2$ in the sub-period $SP_{(N+1)}$, that is, the set target value is zero. As illustrated in FIG. 9, when the subsequent period PB is the period P1, the target value of the absolute value $|\Gamma_2|$ of the reflectance coefficient $\Gamma_2$ in the sub-period $SP_{(N+1)}$, that is, the set target value is larger than zero, for example, 0.3 or more and 0.5 or less. In the embodiment, the TL may be set to 0.5 seconds or more and the $\Delta\Gamma_2$ may be set to 0.2 or less. Further, the TL may be set to 0.2 seconds or more and the $\Delta\Gamma_2$ may be set to 0.1 or less. Further, the TL may be set to 0.5 seconds or more and the $\Delta\Gamma_2$ may be set to 0.05 or less.

The controller 42c sets the load impedance of the radio-frequency power supply 38. Specifically, the controller 42c adjusts the load impedance of the radio-frequency power supply 38 in the sub-period $SP_i$ from the target value of the absolute value $|\Gamma_2|$ of the reflectance coefficient $\Gamma_2$ of the radio-frequency power RF2 in the sub-period $SP_i$ to the target impedance $Z_2$ specified based on the equation (2). Further, the controller 42c may specify the load impedance of the radio-frequency power supply 38 in the sub-period $SP_i$ from the measured value of the load impedance of the radio-frequency power supply 38 obtained by the sensor 42b. The sensor 42b may obtain the measured value of the load impedance of the radio-frequency power supply 38 from the above-mentioned filtration voltage waveform signal and filtration current waveform signal.

When the second mode is designated, the controller 42c may match the load impedance of the radio-frequency power supply 38 with the output impedance (matching point) of the radio-frequency power supply 38 during the period P2. In the second mode as well as in the first and third modes, the controller 42c may gradually change the load impedance of the radio-frequency power supply 38 to the target impedance for the subsequent period PB in the period P2.

In the plasma processing apparatus 1, the matching device 40 gradually changes the load impedance to the target impedance for the subsequent period during the period in which the continuous wave CW1 is supplied before or after the power supplied from the radio-frequency power supply 36 is switched from the power wave W11 to the power wave W12. Thus, the matching device 40 may follow the change in the load impedance to be set after the power from the radio-frequency power supply 36 is switched from the power wave W11 to the power wave W12. Therefore, it is possible to reduce the reflection of the power supplied from the radio-frequency power supply 36 after being switched from the power wave W11 to the power wave W12. Further, the matching device 42 gradually changes the load impedance to the target impedance for the subsequent period during the period in which the continuous wave CW2 is supplied before or after the power supplied from the radio-frequency power supply 38 is switched from the power wave W21 to the power wave W22. Thus, the matching device 42 may follow the change in the load impedance to be set after the power from the radio-frequency power supply 38 is switched from the power wave W21 to the power wave W22. Therefore, it is possible to reduce the reflection of the power supplied from the radio-frequency power supply 38 after being switched from the power wave W21 to the power wave W22.

In the embodiment, the matching device 40 adjusts the load impedance of the radio-frequency power supply 36 in the period P1 to a target impedance different from the output impedance of the radio-frequency power supply 36. According to this embodiment, the reflection from the load on the modulated wave MW1 may be reduced during the period P1. In the embodiment, in each of the first and third modes, the matching device 42 adjusts the load impedance of the radio-frequency power supply 38 in the period P1 to a target impedance different from the output impedance of the radio-frequency power supply 38. According to this embodiment, the reflection from the load on the modulated wave MW2 may be reduced during the period P1.

In the embodiment, a load power control of the modulated wave MW1 may be performed during the period P1. According to this embodiment, even when a reflection occurs due to the target impedance being different from the output impedance of the radio-frequency power supply 36 in the period P1, the modulated wave MW1 of the target power level may be coupled to the plasma. In the embodiment, a load power control of the modulated wave MW2 may be performed during the period P1. According to this embodiment, even when a reflection occurs due to the target impedance being different from the output impedance of the radio-frequency power supply 38 in the period P1, the modulated wave MW2 of the target power level may be coupled to the plasma.

Figure 10:
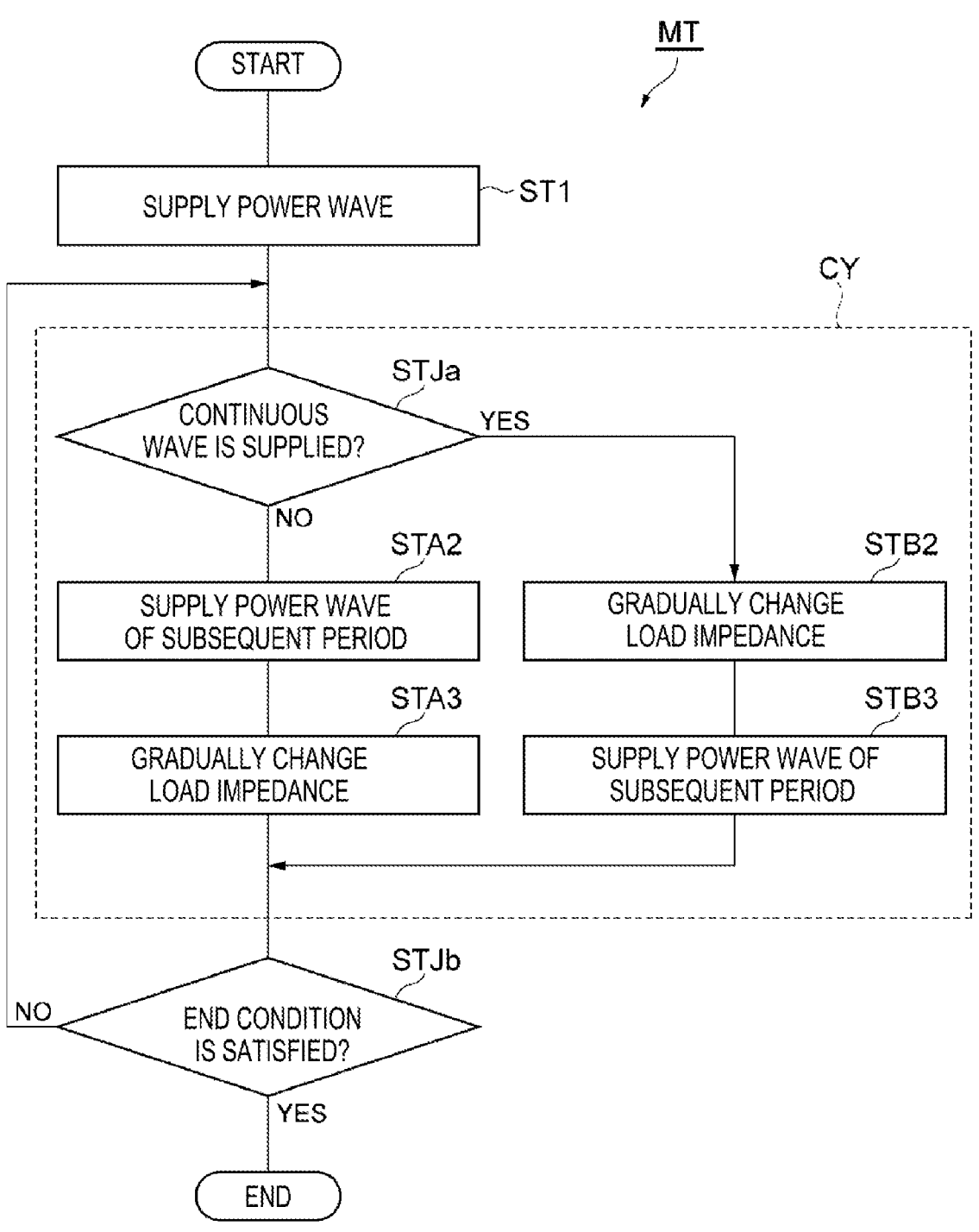
FIG. 10 is a flowchart of a matching method according to the embodiment.

Hereinafter, FIG. 10 will be referenced. FIG. 10 is a flowchart of a matching method according to the embodiment. In the matching method illustrated in FIG. 10 (hereinafter, referred to as a "method MT"), the power supplied from at least one of the radio-frequency power supply 36 and the radio-frequency power supply 38 is switched from the power wave of one of the continuous wave and the modulated wave to the power wave of the other. That is, in the method MT, the power wave W11 is supplied from the radio-frequency power supply 36, and the power wave W21 is supplied from the radio-frequency power supply 38. Next, at least one of the power wave W12 from the radio-frequency power supply 36 and the power wave W22 from the radio-frequency power supply 38 is supplied. The power wave W11 may be supplied from the radio-frequency power supply 36 for two consecutive periods, or the power wave W21 may be supplied from the radio-frequency power supply 36 for two consecutive periods. In the method MT, the power supplied from at least one of the radio-frequency power supply 36 and the radio-frequency power supply 38 may be alternately switched from the power wave of one of the continuous wave and the modulated wave to the power wave of the other.

The method MT is started in step ST1. In step ST1, the power wave W11 is supplied from the radio-frequency power supply 36, and the power wave W21 is supplied from the radio-frequency power supply 38. During the execution of step ST1, the load impedance of the radio-frequency power supply 36 is set by the matching device 40. When the power wave W11 is the modulated wave MW1, the load impedance of the radio-frequency power supply 36 may be adjusted to a target impedance different from the output impedance of the radio-frequency power supply 36 as described above during the execution of step ST1. Further, when the power wave W11 is the modulated wave MW1, the load power control may be executed by the radio-frequency power supply 36 as described above during the execution of step ST1.

When the power wave W11 is the continuous wave CW1, the load impedance of the radio-frequency power supply 36 may be matched with the output impedance of the radio-frequency power supply 36 during the execution of step ST1. Further, when the power wave W11 is the continuous wave CW1, similar to the case where the power wave W11 is the modulated wave MW1, the load impedance of the radio-frequency power supply 36 may be adjusted to a target impedance different from the output impedance of the radio-frequency power supply 36 during the execution of step ST1.

During the execution of step ST1, the load impedance of the radio-frequency power supply 38 is set by the matching device 42. When the power wave W21 is the modulated wave MW2, the load impedance of the radio-frequency power supply 38 may be adjusted to a target impedance different from the output impedance of the radio-frequency power supply 38 as described above during the execution of step ST1. Further, when the power wave W21 is the modulated wave MW2, the load power control may be executed by the radio-frequency power supply 38 as described above during the execution of step ST1.

When the power wave W21 is the continuous wave CW2, the load impedance of the radio-frequency power supply 38 may be matched with the output impedance of the radio-frequency power supply 38 during the execution of step ST1. Further, when the power wave W21 is the continuous wave CW2, similar to the case where the power wave W21 is the modulated wave MW2, the load impedance of the radio-frequency power supply 36 may be adjusted to a target impedance different from the output impedance of the radio-frequency power supply 36 during the execution of step ST1.

In step STJa, it is determined whether the power wave supplied in the preceding period PA out of the two consecutive periods is a continuous wave. When the continuous wave CW1 is not supplied in the preceding period PA, that is, when the modulated wave MW1 is supplied, step STA2 is executed in the succeeding period PB of the two consecutive periods. When the modulated wave MW1 is supplied in the preceding period PA and the continuous wave CW1 is supplied in the subsequent period PB, step STA3 is executed in the subsequent period PB. When the continuous wave CW1 is not supplied in the preceding period PA, step STAB is executed in the subsequent period PB. When the modulated wave CW1 is supplied in the preceding period PA and the continuous wave MW1 is supplied in the subsequent period PB, step STA2 is executed in the preceding PB.

When the continuous wave CW2 is not supplied in the preceding period PA, that is, when the modulated wave MW2 is supplied, step STA2 is executed in the subsequent period PB. When the modulated wave MW2 is supplied in the preceding period PA and the continuous wave CW2 is supplied in the subsequent period PB, step STA3 is executed in the subsequent period PB. When the continuous wave CW2 is not supplied in the preceding period PA, step STB3 is executed in the subsequent period PB. When the modulated wave CW2 is supplied in the preceding period PA and the continuous wave MW2 is supplied in the subsequent period PB, step STB2 is executed in the preceding PB.

Step STA2 is executed when the modulated wave MW1 is supplied in the preceding period PA. In step STA2, the power wave of the subsequent period PB is supplied from the radio-frequency power supply 36. When the power wave supplied from the radio-frequency power supply 36 in step STA2 is the continuous wave CW1, the load impedance of the radio-frequency power supply 36 is gradually changed in step STA3 after the start of the subsequent period PB to the target impedance for the subsequent period PB as described above. When the power wave supplied from the radio-frequency power supply 36 in step STA2 is the modulated wave MW1, the load impedance of the radio-frequency power supply 36 may be set to a target impedance different from the output impedance of the radio-frequency power supply 36.

Step STA2 is executed when the modulated wave MW2 is supplied in the preceding period PA. In step STA2, the power wave of the subsequent period PB is supplied from the radio-frequency power supply 38. When the power wave supplied from the radio-frequency power supply 38 in step STA2 is the continuous wave CW2, the load impedance of the radio-frequency power supply 38 is gradually changed in step STA3 after the start of the subsequent period PB to the target impedance for the subsequent period PB as described above. When the power wave supplied from the radio-frequency power supply 38 in step STA2 is the modulated wave MW2, the load impedance of the radio-frequency power supply 38 may be set to a target impedance different from the output impedance of the radio-frequency power supply 38.

When the continuous wave CW1 is not supplied in the preceding period PA, step STB3 is executed in the subsequent period PB. In step STB3, the power wave of the subsequent period PB is supplied from the radio-frequency power supply 36. When the power wave supplied from the radio-frequency power supply 36 in step STB3 is the modulated wave MW1, step STB2 is executed in the preceding period PA before the start of the subsequent period PB. In step STB2, the load impedance of the radio-frequency power supply 36 is gradually changed to the target impedance for the subsequent period PB as described above. When the power wave supplied from the radio-frequency power supply 36 in step STB3 is the modulated wave CW1, the load impedance of the radio-frequency power supply 36 may be set to a target impedance different from the output impedance of the radio-frequency power supply 36.

When the continuous wave CW2 is not supplied in the preceding period PA, step STB3 is executed in the subsequent period PB. In step STB3, the power wave of the subsequent period PB is supplied from the radio-frequency power supply 38. When the power wave supplied from the radio-frequency power supply 38 in step STB3 is the modulated wave MW2, step STB2 is executed in the preceding period PA before the start of the subsequent period PB. In step STB2, the load impedance of the radio-frequency power supply 38 is gradually changed to the target impedance for the subsequent period PB as described above. When the power wave supplied from the radio-frequency power supply 38 in step STB3 is the continuous wave CW2, the load impedance of the radio-frequency power supply 38 may be matched with the output impedance of the radio-frequency power supply 38.

In step STJb, it is determined whether the end condition has been satisfied. The end condition is satisfied when the number of executions of the cycle CY represented in FIG. 10 has reached a predetermined number of times. When it is determined that the end condition has not been satisfied, the cycle CY is repeated from step STJa. When it is determined that the end condition has been satisfied, the method MT is ended.

Although various embodiments have been described above, the present disclosure is not limited to the embodiments described above, and various omissions, substitutions, and changes may be made. In addition, it is possible to combine the elements in other embodiments to form other embodiments.

For example, the plasma processing apparatus 1 was a capacitively coupled plasma processing apparatus. However, the idea of the present disclosure is applicable to any plasma processing apparatus configured to supply the modulated radio-frequency power from the radio-frequency power supply to the electrodes. Examples of such a plasma processing apparatus include an inductively coupled plasma processing apparatus, an electron cyclotron resonance (ECR) plasma processing apparatus, and a plasma processing apparatus that uses a surface wave such as a microwave for generating plasma.

Further, the plasma processing apparatus 1 is illustrated to use both the radio-frequency power RF1 and the radio-frequency power RF2 for plasma processing, but only one of the radio-frequency power RF1 and the radio-frequency power RF2 may be used for the plasma processing.

Hereinafter, an experiment performed using the plasma processing apparatus 1 will be described. In the experiment, plasma was generated in the plasma processing apparatus 1 in the third mode. In the experiment, two types of power, 400 W and 1000 W, were used as the power level of the radio-frequency power RF2. Further, in the experiment, different values were set for each of the above-mentioned TL and $\Delta\Gamma_2$. Other conditions in the experiment are as follows.

<Condition>

Frequency of radio-frequency power RF1: 60 MHz

Power of continuous wave CW1: 300 W

Frequency of radio-frequency power RF2: 40.68 MHz

Power of modulated wave MW2 in first sub-period SP11 and power of continuous wave CW2 in period P2: 400 W or 1000 W Power of modulated wave MW2 in second sub-period SP12: 0 W Duty ratio of modulated wave MW2: 1 kHz Duty ratio of modulated wave MW2: 90%

In the experiment, the VPP of the susceptor 16 was measured according to the radio-frequency power RF2. The VPP is a peak-to-peak value of the voltage of the susceptor 16 according to the radio-frequency power RF2. In the experiment, the ratio (%) of the amount of decrease in VPP caused by changing the power supplied to the susceptor 16 from the modulated wave MW2 to the continuous wave CW2 with respect to the VPP when the reflection was substantially not observed (hereinafter, referred to as a "decrease rate") was calculated. Table 1 represents the decrease rate when the power of the modulated wave MW2 in the first sub-period SP11 and the power of the continuous wave CW2 in the period P2 are set to 400 W. Table 2 represents the decrease rate when the power of the modulated wave MW2 in the first sub-period SP11 and the power of the continuous wave CW2 in the period P2 are set to 1000 W.

TABLE 1

| | | TL(sec) | | |
|---|---|---|---|---|
| | | 0.2 | 0.5 | 1.0 |
| $\Delta\Gamma_2$ | 0.20 | 10.4 | 8.7 | 8.3 |
| | 0.10 | 4.6 | 1.4 | 1.3 |
| | 0.05 | 2.7 | 0.0 | 0.0 |
| | 0.04 | 0.0 | 0.0 | 0.0 |

TABLE 2

| | | TL(sec) | | |
|---|---|---|---|---|
| | | 0.2 | 0.5 | 1.0 |
| $\Delta\Gamma_2$ | 0.20 | 11.7 | 9.0 | 9.7 |
| | 0.10 | 0.9 | 0.6 | 0.6 |
| | 0.05 | 0.2 | 0.0 | 0.0 |
| | 0.04 | 0.1 | 0.0 | 0.0 |

As represented in Tables 1 and 2, as a result of the experiment, when TL is set to 0.5 seconds or more and $\Delta\Gamma_2$ is set to 0.2 or less, or when TL is set to 0.2 seconds or more and $\Delta\Gamma_2$ is set to 0.1 or less, the decrease rate was 10% or less. Therefore, when TL is set to 0.5 seconds or more and $\Delta\Gamma_2$ is set to 0.2 or less, or when TL is set to 0.2 seconds or more and $\Delta\Gamma_2$ is set to 0.1 or less, it was confirmed that the reflection was effectively suppressed. Further, when the TL is set to 0.5 seconds or more and the $\Delta\Gamma_2$ is set to 0.05 or less, the decrease rate was 0%. Therefore, when the TL is set to 0.5 seconds or more and the $\Delta\Gamma_2$ is set to 0.05 or less, it was confirmed that almost no reflection occurred.

According to the embodiment, it is possible to reduce the reflection from the load after switching the power supplied to the electrodes of the plasma processing apparatus from one of the modulated wave and the continuous wave of the radio-frequency power to the other thereof.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:

a chamber configured to perform a plasma processing on a target substrate;

an electrode provided in the chamber and configured to supply a radio-frequency power to the chamber for the plasma processing in the chamber;

a radio-frequency power supply electrically connected to the electrode and configured to generate the radio-frequency power supplied to the electrode; and a matching box connected between the radio-frequency power supply and the electrode and configured to set a load impedance on a load side of the radio-frequency power supply, wherein the radio-frequency power supply is configured to supply one of a modulated wave and a continuous wave of the radio-frequency power to the electrode in a preceding period of two consecutive periods, and supply a remaining one of the modulated wave and the continuous wave to the electrode in a subsequent period of the two consecutive periods, wherein the continuous wave is a wave with a steady unchanged power level and the modulated wave is a wave where two power levels are alternately and periodically repeated, the radio-frequency power supply generates the modulated wave so that a power level of the radio-frequency power in a first sub-period of alternating first sub-period and second sub-period is higher than a power level of the radio-frequency power in the second sub-period, and the matching box is configured to gradually change the load impedance to a target impedance for the subsequent period by gradually changing the load impedance during a period in which the continuous wave is supplied out of the two consecutive periods, wherein the matching box is configured to gradually change the load impedance so that an absolute value of a reflectance coefficient of the radio-frequency power is gradually changed to a set target value for the subsequent period during the period in which the continuous wave is supplied, and wherein the matching box is configured to gradually and step-wise change the absolute value of the reflectance coefficient to the set target value for the subsequent period through a plurality of consecutive sub-periods during the period in which the continuous wave is is supplied, a time length of each of the plurality of sub-periods is set to 0.2 seconds or more, and a difference between a target value of the absolute value of the reflectance coefficient in one sub-period of any two consecutive sub-periods included in the plurality of consecutive sub-periods, and a target value of the absolute value of the reflectance coefficient in a remaining sub-period is set to or less.

2. The plasma processing apparatus according to claim 1, wherein the matching box is configured to gradually change the load impedance so that the absolute value of the reflectance coefficient of the radio-frequency power is gradually increased to the set target value larger than zero before the radio-frequency power supplied from the radio-frequency power supply to the electrode is switched from the continuous wave to the modulated wave.

3. The plasma processing apparatus according to claim 2, wherein the set target value is 0.3 or more and 0.5 or less.

4. The plasma processing apparatus according to claim 1, wherein the difference is set to 0.05 or less.

* * * * *